United States Patent
Nishioka

(10) Patent No.: US 8,223,444 B2
(45) Date of Patent: Jul. 17, 2012

(54) MEDIUM EXHIBITING NEGATIVE REFRACTION, OPTICAL ELEMENT, AND OPTICAL SYSTEM

(75) Inventor: Kimihiko Nishioka, Hachioji (JP)

(73) Assignee: Olympus Corporation, Tokyo (JP)

( * ) Notice: Subject to any disclaimer, the term of this patent is extended or adjusted under 35 U.S.C. 154(b) by 1327 days.

(21) Appl. No.: 11/319,283

(22) Filed: Dec. 29, 2005

(65) Prior Publication Data

US 2006/0171032 A1  Aug. 3, 2006

(30) Foreign Application Priority Data

Jan. 7, 2005 (JP) .................................. 2005-002854

(51) Int. Cl.
*G02B 9/00* (2006.01)
(52) U.S. Cl. ........................................ 359/796; 359/797
(58) Field of Classification Search ................... 359/708, 359/566, 260, 737, 796, 797
See application file for complete search history.

(56) References Cited

U.S. PATENT DOCUMENTS

| 6,798,553 | B1 * | 9/2004 | Scobey et al. ................. 359/260 |
| 7,339,539 | B2 * | 3/2008 | Joannopoulos et al. ...... 343/754 |
| 2003/0227415 | A1 | 12/2003 | Joannopoulos et al. |

FOREIGN PATENT DOCUMENTS

| JP | 2004-133040 | 4/2004 |
| JP | 2004-326089 | 11/2004 |

OTHER PUBLICATIONS

M. Notomi, "*Negative refraction in photonic crystals*," Optical and Quantum Electronics 34(1/3): 133-142 (Mar. 2002).
Japanese Office Action, dated Apr. 26, 2011, issued in corresponding Japanese Patent Application No. 2006-002644.

\* cited by examiner

*Primary Examiner* — Jack Dinh
(74) *Attorney, Agent, or Firm* — Kenyon & Kenyon LLP

(57) ABSTRACT

An optical element using a medium exhibiting negative refraction, a carbon nano tube being used for the medium exhibiting negative refraction, is disclosed. There is also disclosed an optical system having a plurality of optical elements each formed of a medium exhibiting negative refraction, wherein the plurality of optical elements includes optical elements having different chromatic dispersions.

16 Claims, 9 Drawing Sheets

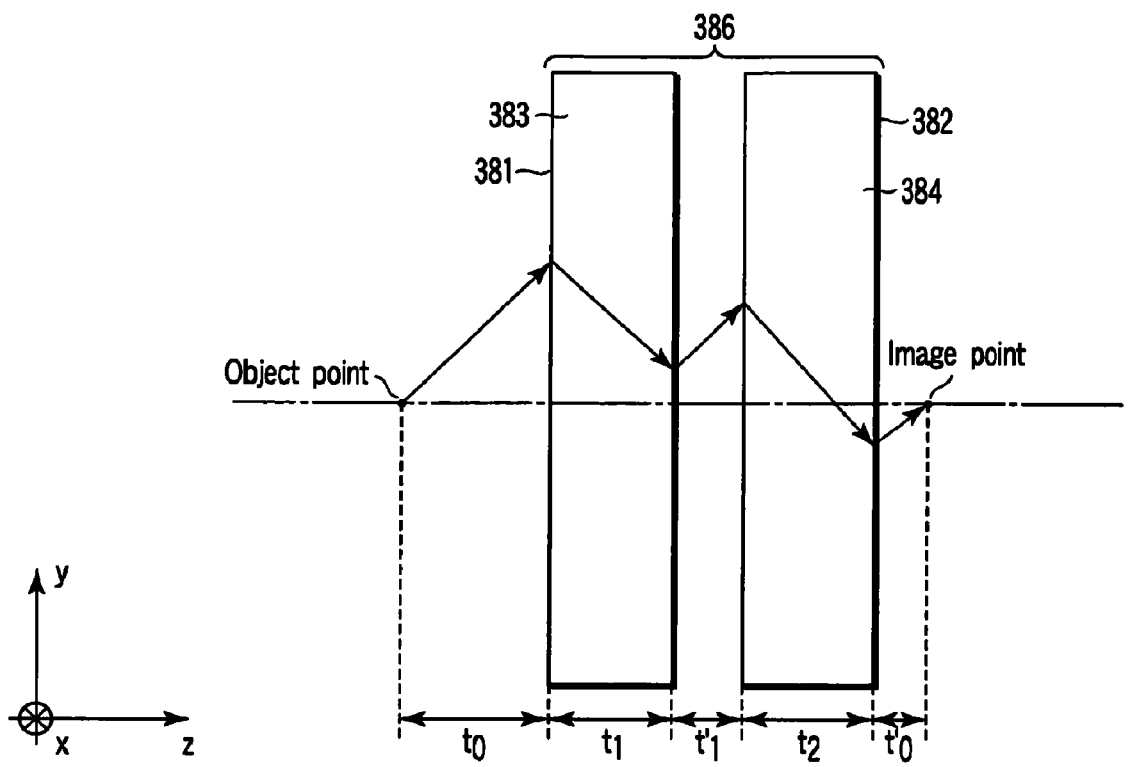
F I G. 2
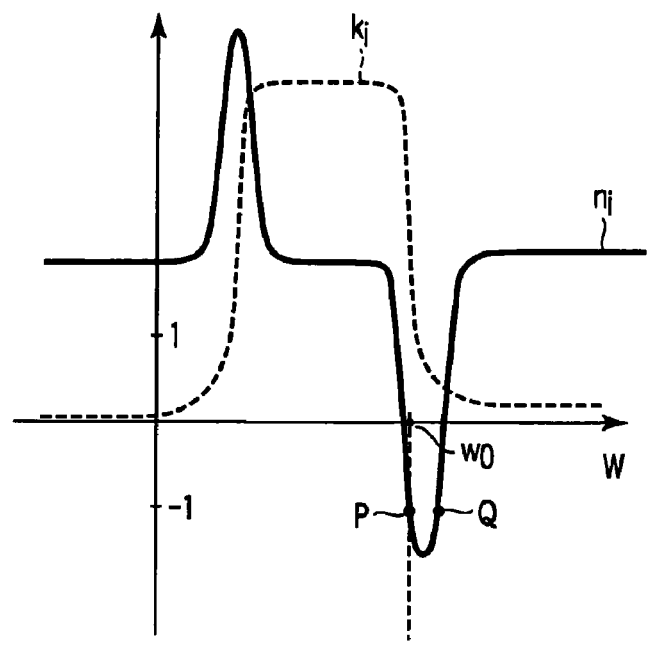
F I G. 3

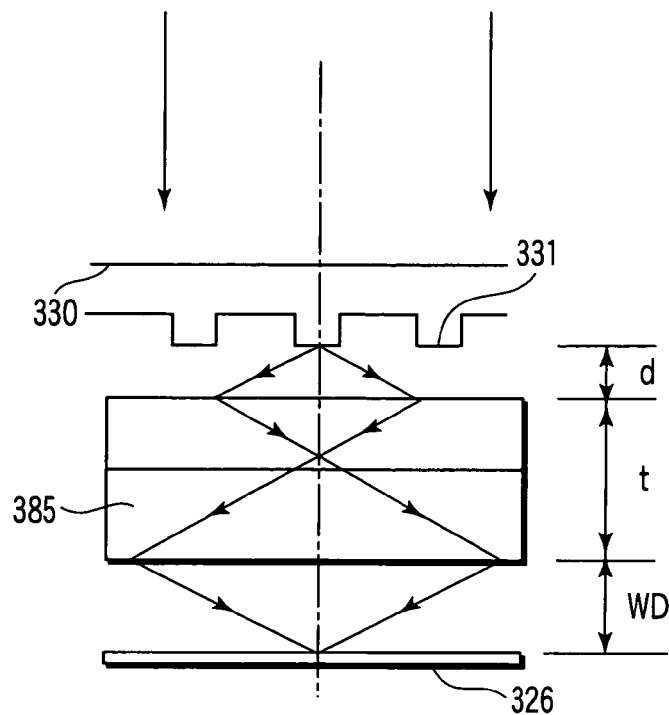
F I G. 11
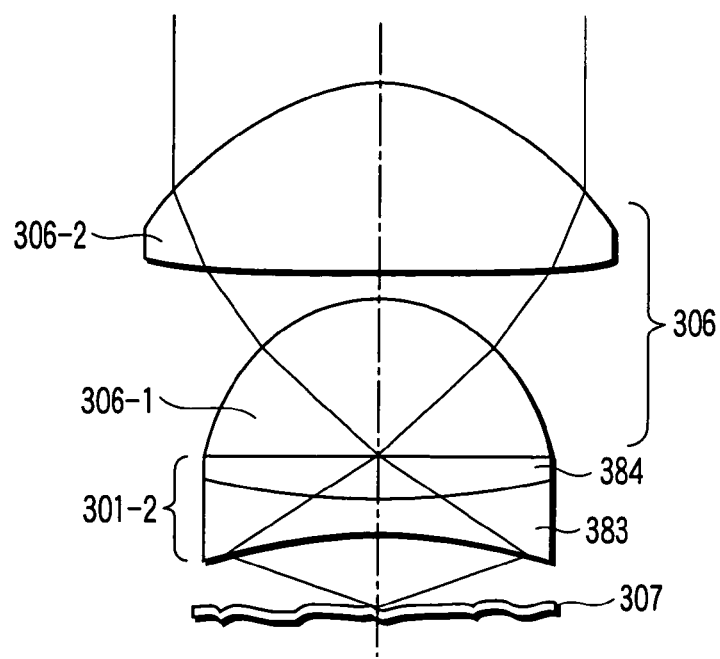
F I G. 12

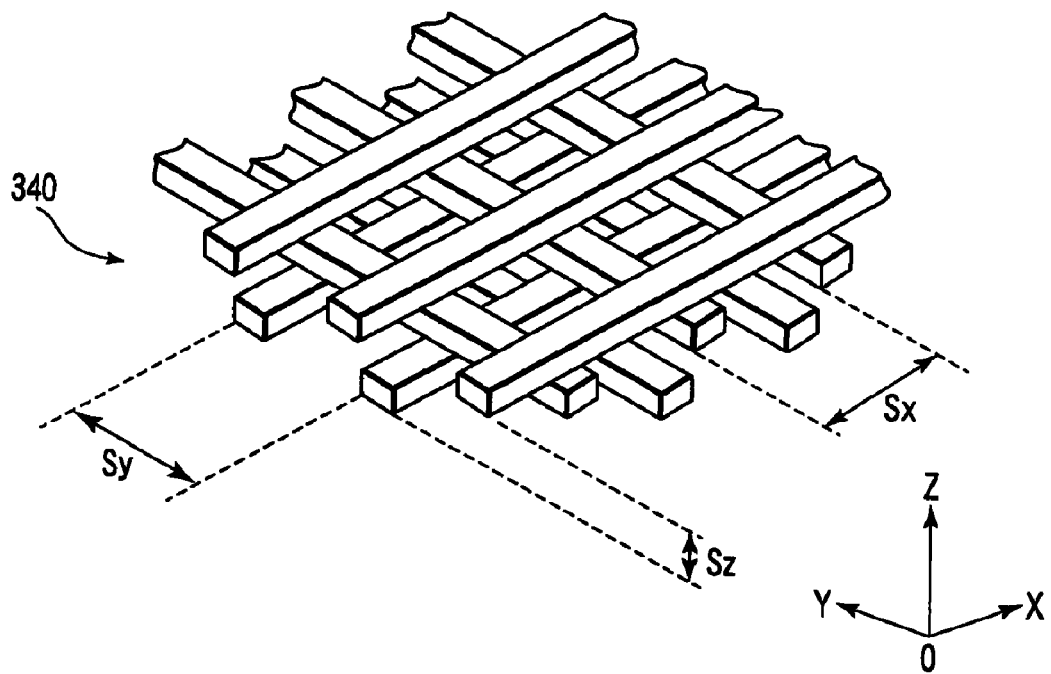
F I G. 13
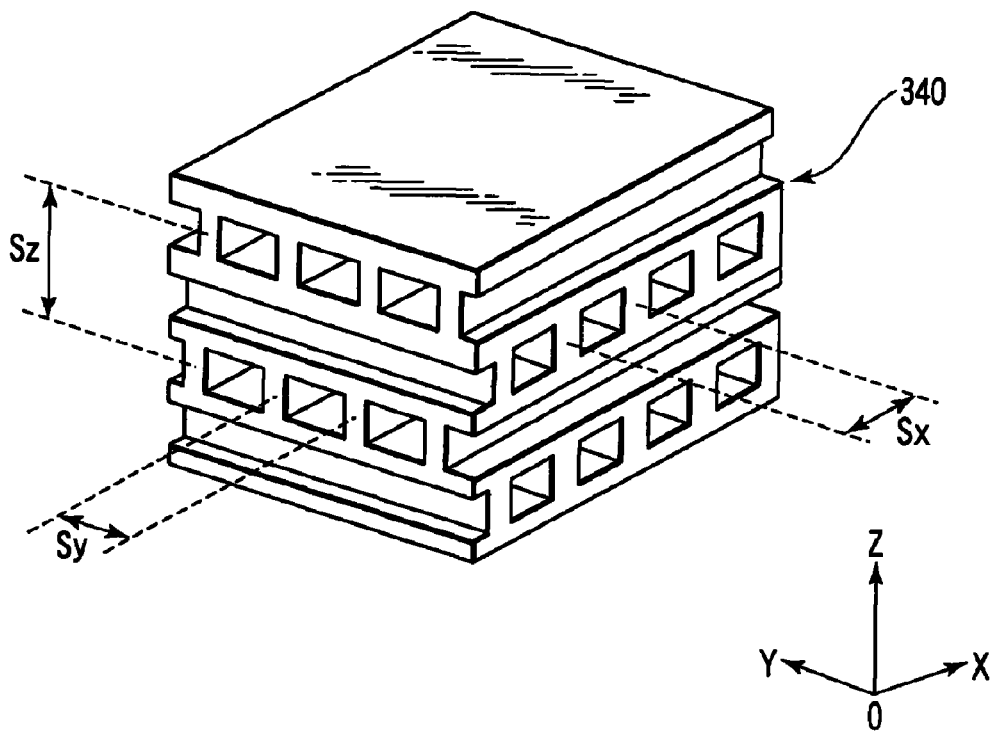
F I G. 14

Microscope using negative refractive index medium

MEDIUM EXHIBITING NEGATIVE REFRACTION, OPTICAL ELEMENT, AND OPTICAL SYSTEM

CROSS-REFERENCE TO RELATED APPLICATIONS

This application is based upon and claims the benefit of priority from prior Japanese Patent Application No. 2005-002854, filed Jan. 7, 2005, the entire contents of which are incorporated herein by reference.

BACKGROUND OF THE INVENTION

1. Field of the Invention

The present invention relates to a medium exhibiting negative refraction, and an optical system which includes an optical element formed of such a medium.

2. Description of the Related Art

Conventionally, there has been well known: an optical element using an optical or electromagnetic wave; an optical system such as an image pickup optical system, an observation optical system, a projection optical system and a signal processing system; and an optical device using them. These optical systems have had a disadvantage that image resolution is limited due to diffraction caused by undulation property of an optical or electromagnetic wave.

In order to overcome this disadvantage, the following non-patent documents 2 and 5, etc. describe that a negative refractive index medium is used as a technique for achieving image formation which exceeds the diffraction limit.

FIG. 16 is an illustrative view showing image formation using a parallel flat plate 380 formed of a negative refractive index medium 301. In FIG. 16, $t_0$ denotes a distance between an object point and a left side face of the flat plate 380; $t_0'$ denotes a distance between an image point and a right side face of the flat plate 380; "t" denotes a thickness of the flat plate 380; "i" denotes an incident angle; "r" denotes a refractive angle; and $n_s$ denotes a refractive index of the negative refractive index medium 301 to a vacuum.

A refractive index at the periphery of the flat plate 380 is defined as $n_0$, and $n_0=1$ is established in the case of a vacuum. FIG. 16 shows a case in which $n_0=1$ and $n_s=-1$ are established.

The arrow indicates an emitted light component among the light beams emitted from an object. Because a refraction law is established according to non-patent document 2, the following formula is established:

$$n_0 \sin i = n_s \sin r \qquad \text{Formula (101)}$$

Assuming that $n_0=1$ and $n_s=-1$, the following formula is established:

$$r=-i \qquad \text{Formula (102)}$$

Therefore, a light beam of the emitted light component is formed as an image point at a point at which $t_0'$ satisfies the following formula:

$$t_0+t_0'=t \qquad \text{Formula (103)}$$

On the other hand, an evanescent wave generated from an object point is produced as intensity equal to that of the object point at a point at which $t_0'$ satisfies formula (103). All the light beams emitted from the object are collected at the image point, and thus, image formation exceeding the diffraction limit is achieved. This is referred to as complete image formation. It is known from non-patent document 2 listed below that, even if the periphery of the negative refractive index medium 301 is not a vacuum, complete image formation is achieved when formula (103) and the following formula are satisfied:

$$n_s=-n_0 \qquad \text{Formula (104)}$$

Non-Patent Document 1:
  Mechanism and application of optical system, 73-77, 166-170, Optronics Co., Ltd., 2003
Non-Patent Document 2:
  J. B. Pendtry Phys. Rev. Lett., Vol 85, 18 (2000) 3966-3969
Non-Patent Document 3:
  M. Notomi Phys. Rev. B. Vol 62 (2000) 10696
Non-Patent Document 4:
  V. G. Veselago Sov. Phys. Usp. Vol. 10, 509-514 (1968)
Non-Patent Document 5:
  L. Liu and S. He Optics Express Vol. 12 No. 20 4835-4040 (2004)
Non-Patent Document 6:
  Sato & Kawakami, Optronics, 2001, July issue, page 197
Patent Document 1:
  US 2003/0227415 A1
Patent Document 2:
  US 2002/0175693 A1

BRIEF SUMMARY OF THE INVENTION

According to a first aspect of the present invention, there is provided a medium exhibiting negative refraction, comprising use of a carbon nano tube for the medium exhibiting negative refraction.

According to a second aspect of the present invention, there is provided an optical system having a plurality of optical elements, each of which is formed of a medium exhibiting negative refraction, wherein said plurality of optical elements include optical elements having different chromatic dispersions.

According to a third aspect of the present invention, there is provided an optical system having a plurality of optical elements, each of which is formed of a medium exhibiting negative refraction, wherein said plurality of optical elements include optical elements whose signs of chromatic dispersion are different from each other.

According to a fourth aspect of the present invention, there is provided an optical system including two optical elements, each of which is formed of a medium exhibiting negative refraction, wherein each of the two optical elements has different signs of chromatic dispersion.

According to a fifth aspect of the present invention, there is provided an optical system comprising a plurality of optical elements, each of which is formed of a medium exhibiting negative refraction, wherein
said plurality of optical elements each include two optical elements which satisfies a predetermined relationship, and
the predetermined relationship is a relationship that signs of chromatic dispersion are different from each other, an absolute value of an imaginary portion of one complex refractive index is greater than an absolute value of an imaginary portion of the other complex refractive index, and an absolute value of chromatic dispersion of a medium having a greater absolute value of an imaginary portion of the complex refractive index is greater than an absolute value of chromatic dispersion of the other one.

According to a sixth aspect of the present invention, there is provided an optical system including two optical elements, each of which is formed of a medium exhibiting negative refraction, wherein signs of chromatic dispersion of the optical elements each formed of a medium exhibiting negative refraction are different from each other, and an absolute value of chromatic dispersion of a medium having a greater absolute value of an imaginary portion of a complex refractive index is greater than an absolute value of chromatic dispersion of the other medium.

According to a seventh aspect of the present invention, there is provided an optical system including a plurality of optical elements, each of which is formed of a medium exhibiting negative refraction, wherein two of said plurality of optical elements are different from each other in sign of chromatic dispersion, and an absolute value of chromatic dispersion of a medium having a greater absolute value of an imaginary portion of a complex refractive index is greater than an absolute value of chromatic dispersion of the other medium.

According to an eighth aspect of the present invention, there is provided an optical system including a plurality of optical elements, each of which is formed of a medium exhibiting negative refraction, wherein two of said plurality of optical elements are different from each other in sign of chromatic dispersion, and a thickness of a medium having a greater absolute value of an imaginary portion of a complex refractive index from among the two optical elements is smaller than a thickness of the other medium.

According to a ninth aspect of the present invention, there is provided an optical device having an optical element and an image forming element, the optical element being formed of a medium exhibiting negative refraction.

According to a tenth aspect of the present invention, there is provided an optical device having: an optical element formed of a medium exhibiting negative refraction; an optical element formed of a medium having a positive refractive index; and an image forming element.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a view showing a modified example of the configuration shown in FIG. 1;

FIG. 3 is a view showing an example of a complex refractive index $n_i^* = n_i - jk_i$ of a substance indicating absorption at a specific wavelength region (vibration frequency region);

FIG. 11 is an illustrative view illustrating an embodiment of non-contact type, high resolution lithography;

FIG. 12 is a view showing an embodiment of a lens 301-2 formed of a negative refractive index medium, the lens having a recessed face at the side of an object;

FIG. 13 is a view showing a first specific example of a photonic crystal 340;

FIG. 14 is a view showing a second specific example of the photonic crystal 340;

DETAILED DESCRIPTION OF THE INVENTION

Figure 1:
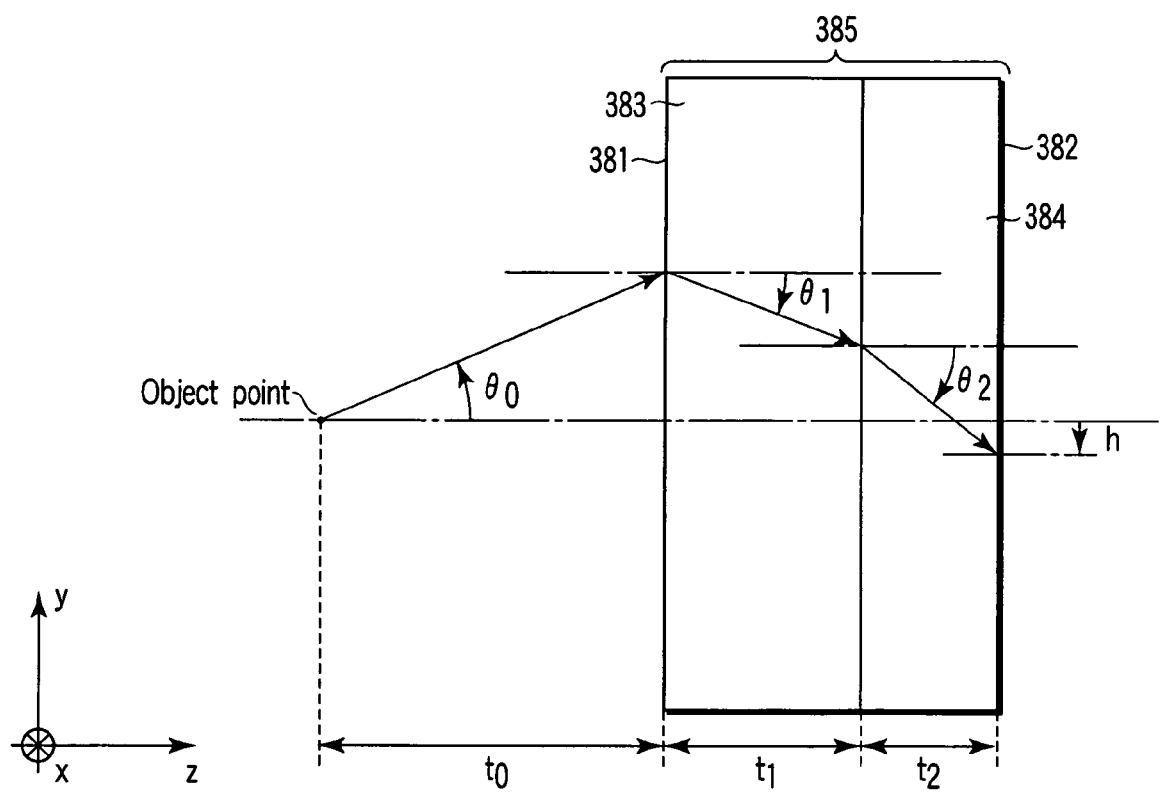
FIG. 1 is a view showing a negative refractive index medium 385 which serves as an optical element having arranged thereon parallel flat plates 381 and 382 serving as optical elements in one embodiment of the present invention.

Hereinafter, embodiments of the present invention will be described in detail with reference to the accompanying drawings. FIG. 1 shows a negative refractive index medium 385 constituted by parallel flat plates 381 and 382 (hereinafter, simply referred to as flat plates) serving as optical elements formed of negative refractive index mediums 383 and 384, respectively, in one embodiment of the present invention. Here, an attempt is made to obtain an emitted light component of a light beam emitted from an object point in this system is formed as an image at a position at which complete image formation should be achieved even if an optical vibration frequency ω slightly changes.

For the sake of simplification of a description, assume that $t_0=0$, namely, an image point exists on a right side face of the flat plate 382.

In FIG. 1, on an x-axis, a direction from a top face to a back face of paper is positive. On a y-axis, an upward direction is positive, and on a z-axis, the right side is positive, and optical incident and emission faces of the flat plates 381 and 382 are vertical to the z-axis.

In the figure, $t_1$ denotes a thickness of the flat plate 381; $t_2$ denotes a thickness of the flat plate 382; $\theta_0$ denotes an incident angle of a light beam of the flat plate 381; $\theta_1$ denotes a refraction angle of a light beam on a left face of the flat plate 381; $\theta_2$ denotes a refraction angle of a light beam on a left face of the flat plate 382; h denotes a light beam height on a right face of the flat plate 382; $n_0$ denotes a refractive index of a medium to a vacuum at the periphery of the flat plates 381 and 382; $n_1$ denotes a refractive index of a medium to a vacuum; and $n_2$ denotes a refractive index of a medium to a vacuum. $n_0$, $n_1$ and $n_2$ are all functions of ω. At this time, the following formula is established:

$$t_0 \tan\theta_0 + t_1 \tan\theta_1 + t_2 \tan\theta_2 = h \qquad \text{Formula (106)}$$

In order for an emitted light component to be formed as an image with no-aberration, it is necessary that h=0 is established. In accordance with a refraction law, the following formula is established:

$$n_0 \sin \theta_0 = n_1 \sin \theta_1 = n_2 \sin \theta_2 \qquad \text{Formula (107)}$$

In order to substantially achieve complete image formation, the following formula may be established:

$$t_0 = t_1 + t_2 \qquad \text{Formula (108)}$$

Considering a case in which $\theta_0$ is smaller than 1, when formulas (106) and (107) are approximated and when h=0, the following formulas are established:

$$t_0 \theta_0 + t_1 \theta_1 + t_2 \theta_2 = 0 \qquad \text{Formula (109)}$$

$$n_0 \theta_0 = n_1 \theta_1 = n_2 \theta_2 \qquad \text{Formula (110)}$$

When $\theta_0$, $\theta_1$, $\theta_2$ and $t_0$ are erased from formula (109) by using formulas (108) and (110), the following formula is obtained:

$$t_1 \left( \frac{n_1 + n_0}{n_1} \right) + t_2 \left( \frac{n_2 + n_0}{n_2} \right) = 0 \qquad \text{Formula (111)}$$

Here, in order to carry out substantially complete image formation, it is necessary that $n_1$ and $n_2$ are values close to $-n_0$, and thus, the following formulas can be placed:

$$n_1 = -n_0 + \Delta n_1 \qquad \text{Formula (112)}$$

$$n_2 = -n_0 + \Delta n_2 \qquad \text{Formula (113)}$$

$$\left| \frac{\Delta n_1}{n_0} \right| \ll 1 \qquad \text{Formula (114)}$$

$$\left| \frac{\Delta n_2}{n_0} \right| \ll 1 \qquad \text{Formula (115)}$$

When formulas (112) and (113) are substituted into formula (111), the following formula is established:

$$t_1 \left( \frac{\Delta n_1}{-n_0 + \Delta n_1} \right) + t_2 \left( \frac{\Delta n_2}{-n_0 + \Delta n_2} \right) = 0 \qquad \text{Formula (116)}$$

When approximation is carried out considering formulas (114) and (115), the following formula (117) is established:

$$t_1 \Delta n_1 + t_2 \Delta n_2 = 0 \qquad \text{Formula (117)}$$

When both sides are divided by $\Delta \omega$, and then, a limit of $\Delta \omega \to 0$ is taken, the following formula is obtained:

$$t_1 \frac{\partial n_1}{\partial \omega} + t_2 \frac{\partial n_2}{\partial \omega} = 0 \qquad \text{Formula (118)}$$

This is a condition for which, when $n_1$ and $n_2$ are changed with a change of $\omega$, namely, when the negative refractive index mediums 383 and 384 each have chromatic dispersion, an emitted light component arrives at a point at which complete image formation should be achieved.

Therefore, even in the case where a light beam having a wavelength width is emitted from an object, chromatic aberration of an emitted light component is approximately eliminated when formula (118) is satisfied, and substantially complete image formation can be achieved.

When a condition for achieving substantially complete image formation is summarized in the system shown in FIG. 1, the formulas (108), (112), (113), (114), (115) and (118) are established.

Of course, because $t_1 > 0$ and $t_2 > 0$, a sign must be different from that defined in the following formula in order to establish the formula (118):

$$\frac{\partial n_1}{\partial \omega} \text{ and } \frac{\partial n_2}{\partial \omega}$$

Namely, it is necessary that chromatic dispersion of the negative refractive index medium 383 which forms the flat plate 381 is oppose to that of the negative refractive index medium 384 which forms the flat plate 382 in sign. H is defined in accordance with the following formula:

$$-\frac{t_1 \frac{\partial n_1}{\partial \omega}}{t_2 \frac{\partial n_2}{\partial \omega}} = H \qquad \text{Formula (130)}$$

When the formula (118) is established, H=1 is obtained. In practice, because chromatic aberration may be slightly left, the following formula may be established:

$$0.7 \leq H \leq 1.4 \qquad \text{Formula (131)}$$

Depending on a condition for an optical product to be used, the following formula is established:

$$0.4 \leq H \leq 2.5 \qquad \text{Formula (132)}$$

Depending on an object of utilizing a optical product, the following formula may be permitted:

$$0.2 \leq H \leq 5 \qquad \text{Formula (133)}$$

While the foregoing description has been given with respect to a case of $t_0 = 0$, the following formula is also established:

$$t_0' \neq 0$$

Even in the above case, the formula (118) is established by substituting the formula (108) by the following formula:

$$t_0 + t_0' = t_1 + t_2 \qquad \text{Formula (108-2)}$$

Alternatively, as shown in FIG. 2, even when there is a gap of $t_1'$ between the flat plate 381 and the flat plate 382, the formula (118) is established by substituting the formula (108) by the following formula:

$$t_0 + t_0' + t_1' = t_1 + t_2 \qquad \text{Formula (108-3)}$$

In FIG. 2, the flat plate 381 and the flat plate 382 are referred to as a negative refractive index medium 386 altogether. Assume that N, for example, three or more flat plates are made of a negative refractive index medium. Similarly, even in such a case, when the following formula is established instead of the formula (118):

$$\sum_{i=1}^{N} t_i \frac{\partial n_i}{\partial \omega} = 0 \qquad \text{Formula (118-2)}$$

when the following formula is established instead of formula (108);

$$t_0 + t_0' + t_1' + t_2' \ldots t_{N-1'} = t_1 + t_2 + \ldots t_N \qquad \text{Formula (108-4)}$$

when the following formula is established instead of formula (112);

$$n_i = -n_0 + \Delta n_i \qquad \text{Formula (112-2); and}$$

when the following formula is established instead of formula (114), chromatic aberration of an emitted light component is eliminated, and substantially complete image formation can be achieved:

$$\left|\frac{\Delta n_i}{n0}\right| \ll 1 \qquad \text{Formula (114-2)}$$

In the above formulas, $n_i$ denotes a refractive index relevant to a vacuum of an i-th negative refractive index medium; $t_i$ denotes a thickness of the i-th negative refractive index medium; and $t'_i$ denotes a gap between a flat plate of the i-th negative refractive index medium and a flat plate of an i+1-th negative refractive index medium.

Figure 4:
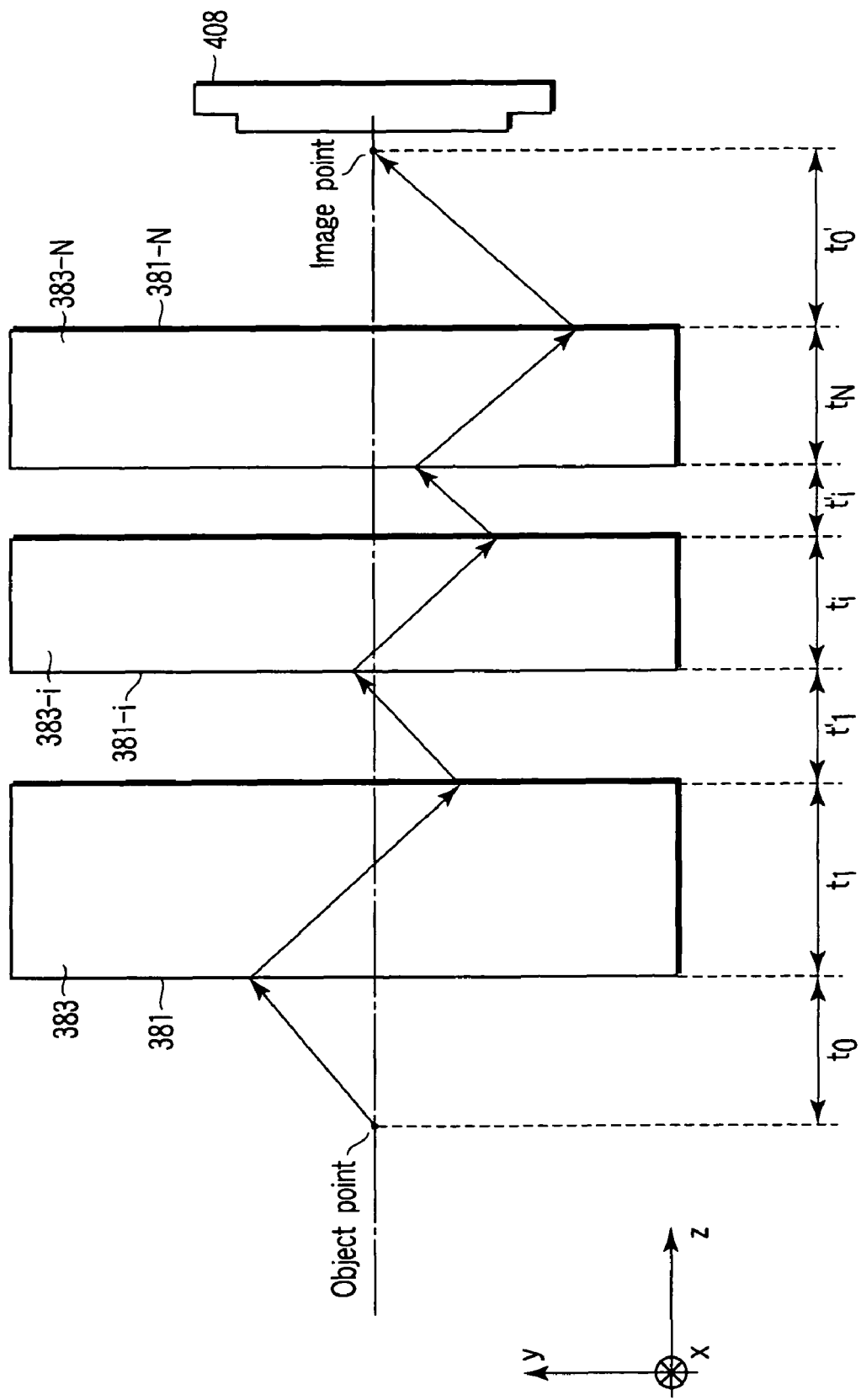
FIG. 4 is a view showing a configuration in the case where N flat plates 381 exist.

FIG. 4 shows a configuration in the case where N flat plates 381 exist. In this configuration, 381-i and 381-N denote optical elements each formed of a negative refractive index medium; and 383-1 and 383-N denote negative refractive index mediums.

From among each term of the left side in formula 118-2, a sum of positive terms or terms of 0 is defined as $G_+$, and a sum of only negative terms is defined as $G_-$. When $H_N$ is defined in accordance with the following formula:

$$H_N = -\frac{G_+}{G_-} \qquad \text{Formula (140)}$$

$H_N = 1$ is obtained in the case where formula (118-2) is established. In practice, chromatic aberration may be left slightly, and the following formula may be established:

$$0.7 \leq H_N \leq 1.4 \qquad \text{Formula (141)}$$

Depending on a condition for an optical product to be used, the following formula may be established:

$$0.4 \leq H_N \leq 2.5 \qquad \text{Formula (142)}$$

Depending on an object of utilizing an optical product, the following formula may be permitted:

$$0.2 \leq H_N \leq 5 \qquad \text{Formula (143)}$$

With respect to the emitted light component of the light beams emitted from the above object, a condition for improving image resolution has been derived. With respect to an evanescent wave as well, the following condition is considered:

$$\theta_0 \ll 1$$

In this case, as a distance from an object becomes long, the evanescent wave attenuates exponentially in a negative refractive index medium, and the evanescent wave is amplified exponentially in a negative refractive index medium. In addition, as an absolute value of a negative refractive index increases, the amplitude of the evanescent wave increases. Thus, when formula (117) is satisfied, the evanescent wave has the substantially same amplitude depending on $\omega$ at the right side face of the negative refractive index medium 384, and is close to complete image formation in the system shown in FIG. 1.

Therefore, the formulas (118), (131), (132) and (133) and the formulas (141), (142) and (143) are established as an approximately preferred condition with respect to image formation of the evanescent wave.

When chromatic dispersion is positive and $n_i < 0$ in accordance with the following formula:

$$\frac{\partial n_i}{\partial \omega}$$

a photonic crystal is exemplified as a negative refractive index medium (refer to non-patent document 3).

When chromatic dispersion is negative and $n < 0$ in accordance with the following formula:

$$\frac{\partial n_i}{\partial \omega}$$

a substance indicating absorption at a specific wavelength region (vibration frequency region) is exemplified as a substance.

FIG. 3 shows an example of such a substance having a complex refractive index of $n_i^* = n_i - jk_i$, wherein $n_i$ denotes a real number portion of the complex refractive index; $k_i$ denotes an imaginary number portion of the complex refractive index; and "j" of the second term on the right side denotes an imaginary number unit.

At point P shown in FIG. 3, $n_i < 0$ and the following equation are established at an optical vibration frequency $\omega_0$:

$$\frac{\partial n_i}{\partial \omega} < 0$$

Therefore, when a photonic crystal is combined with a substance equivalent to the point P shown in FIG. 3 at $\omega = \omega_0$, and the combined material is used for the flat plates 383 and 384, etc., the formulas (118), (131), (132), (133), (141), (142) and (143) can be satisfied.

On the other hand, at point Q shown in FIG. 3, the following formula is established:

$$n_i < 0 \text{ and } \frac{\partial n_i}{\partial \omega} > 0$$

Thus, when $\omega = \omega_0$, another substance is selected in accordance with the following formula:

$$n_i < 0 \text{ and } \frac{\partial n_i}{\partial \omega} > 0$$

Then, the selected substance is combined with a substance which satisfies the following formula:

$$n_i \langle 0 \text{ and } \frac{\partial n_i}{\partial \omega} \langle 0$$

When the combined material is used for the negative refractive index mediums 383 and 384, etc., the formulas (118), (131), (132), (133), (141), (142) and (143) can be satisfied.

A carbon nano tube may be used for a negative refractive index medium. This material is advantageous in that optical characteristics can be artificially changed.

In the case of a system made of two negative refractive index mediums as shown in FIG. 1 or FIG. 2, it is preferable that a thickness of the medium having greater $|k_i|$ is reduced from the imaginary number portion $k_i$ of the complex refractive index of each medium because absorption of an optical or electromagnetic wave is reduced. Therefore, from the formula (118), it is preferable that a medium having greater $|K_j|$ is selected in accordance with the following formula:

$$\left|\frac{\partial n_i}{\partial \omega}\right|$$

Similarly, in a system including three or more refractive index mediums as well, the following formula is established:

$$\frac{\partial n_i}{\partial \omega}$$

When two mediums having their different signs from the above formula have been removed, it is preferable that there exist a set satisfying the above relationship because a loss of an optical or electromagnetic wave is reduced. The term "set" used here denotes two mediums after removed.

In the embodiment shown in FIG. 1, the flat plates 381 and 382 may be bonded with each other by adhesive or the like. Also, these flat plates may be allocated in intimate contact with each other. In addition, one of the flat plates 381 and 382 is used as a substrate, and the other one may be formed on such a substrate in accordance with vapor deposition or the like.

Figure 5:
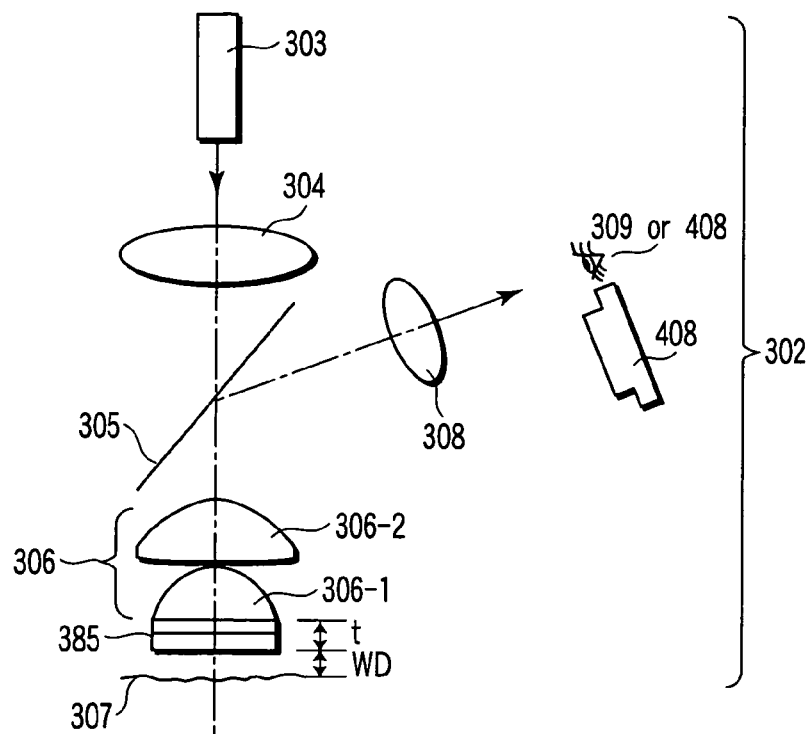
FIG. 5 is a view showing an example of an epi-illumination fluorescence microscope 302 using a negative refractive index medium 385, according to one embodiment of the present invention.

FIG. 5 shows an example of an epi-illumination fluorescence microscope 302 using an negative refractive index medium 385, according to one embodiment of the present invention, the microscope being allocated in midair. Excitation light emitted from a light source 303 (such as a laser light source, xenon lamp, or mercury lamp, for example) passes through an illumination lens 304 and a dichroic mirror 305, and is incident to an objective lens 306. NA (Numerical Aperture) of the objective lens 306 exceeds, for example, 1, and an evanescent wave can be excited. The objective lens 306 includes an optical element formed of a medium having a positive refractive index, for example, lenses 306-1 and 306-2 made of a glass.

Figure 6:
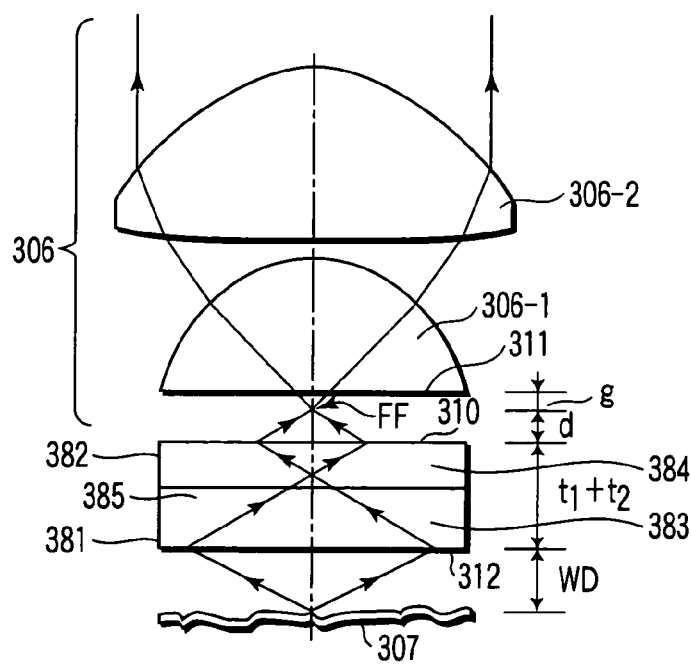
FIG. 6 shows an enlarged view in the vicinity of an objective lens 306 shown in FIG. 5.

FIG. 6 shows an enlarged view in the vicinity of the objective lens 306 shown in FIG. 5. In the figure, a face of the objective lens 306 at a side which is the closest to an object is defined as 311. An intermediate image forming point of the objective lens 306 is defined as FF. A distance between the face 311 and the intermediate image forming point FF is defined as "g".

For example, a parallel flat-plate shaped negative refractive index medium 385 is allocated at a position distant by "d" from the intermediate image forming point FF. "d" denotes a distance between the intermediate image forming point FF and a top face 310 of the negative refractive index medium. A value of "d" is, for example, 50 μm. Reference numeral 312 denotes a face of the negative refractive index medium 385 at the object side.

Fluorescence emitted from an object 307 passes through the negative refractive index medium 385, the objective lens 306, the dichroic mirror 305, and an eyepiece 308. The resulting fluorescence can be observed and picked up as an image by an eye 309 or a TV camera or a cooling CCD camera equipped with an image pickup element 408. Now, this appearance will be described here in detail.

Here, the refractive indexes of the negative refractive index mediums 383 and 384 are defined as −1, and a thickness thereof is defined as "t" (for example, 300 μm). WD denotes a distance between a medium 385 exhibiting negative refractive index and an object 307 or an image forming member described later. A detailed description of WD will be described later.

Because the refractive indexes of the negative refractive index mediums 383 and 384 are about −1, a fluorescent light beam emitted from the object is produced as a refraction which is different from usual, as indicated by the arrow shown in FIG. 6 (refer to non-patent document 2).

When an incident angle is defined as "i", and an emission angle is defined as "r" in accordance with a refraction law, the following formula is established:

$$r = -i \qquad \text{Formula (0-3)}$$

When a specific refractive index relevant to an ambient medium of either of the negative refractive index mediums 383 and 384 is defined as "n", the following formula is established:

$$\sin r = (1/n)\sin i \qquad \text{Formula (0-4)}$$

According to non-patent document 2, the negative refractive index medium 385 completely forms the object 307 as an image at the intermediate image forming point FF when the following formulas are established:

$$t \approx WD + d \qquad \text{Formula (1)}$$

$$t = t_1 + t_2 \qquad \text{Formula (1-1)}$$

The term "complete image formation" used here denotes that all the light beams in the electromagnetic field, including radiation light beams and evanescent waves are formed as an image, the light beams being free from an effect of a refraction limit. Thus, this is equivalent to the fact that an object exists at the intermediate image forming point FF.

A value of "g" is obtained by the formula below:

$$0 \leq g \leq \lambda \qquad \text{Formula (0)}$$

The intermediate image forming point FF is very close to the face 311. This condition is desirable for efficiently utilizing an evanescent wave. In practice, the following formula may be established:

$$0 \leq g \leq 10\lambda \qquad \text{Formula (0-1)}$$

In the formula, λ denotes a wavelength of a light beam to be used, and in the case of a visible light beam, λ ranges from 0.35 μm to 0.7 μm.

In this way, image formation including an evanescent wave of NA>1.0 can be achieved. In addition, a microscope having high image resolution can be provided.

Depending on usage, the following formula may be established:

$$0 \leq g \leq 1000\lambda \qquad \text{Formula (0-1-0)}$$

In formula (0) to formula (0-1-0), it is further preferable to define the lower limit of "g" as 0.1λ/A because adverse effect such as blurring due to the dust or scratch on the lens surface 311 is reduced.

"A" denotes a numerical number (NA) in FF of the objective lens 306. In formula (0) to formula (0-1-0), it is preferable to define the lower limit of "g" as 0.6λ/A because adverse effect such as blurring due to the dust or scratch is reduced. In formula (0) to formula (0-1-0), it is preferable to define the lower limit of "g" as 1.3λ/A because adverse effect such as dust or scratch is further significantly reduced.

Assuming that d=50 μm, WD=250 μm is obtained in accordance with formula (1). A longer WD is advantageous, which has not been achieved conventionally. If "g" ranges 0 to some tens of nanometers, image forming performance is substantially equivalent to a solid immersion lens when the objective lens 306 is directly substantially brought into intimate contact with the object 307.

One embodiment of the present invention is primarily featured in that the optical element (385 or the like) and the image forming optical system (306 or the like) are combined with each other such that chromatic dispersion formed of a negative refractive index medium has been eliminated. In this embodiment, an image forming optical system is allocated at the image side of the negative refractive index medium 301. Fluorescence often has a wavelength width of some tens of nanometers, and thus, advantageous effect of eliminating chromatic dispersion is attained.

In addition, the present embodiment is featured in that an object image (intermediate image) formed by the negative refractive index medium 385 is formed again by the objective lens 306. While an intermediate image is formed as a real image in an example shown in FIG. 6, an imaginary image may be produced depending on usage of an optical system. In the example shown in FIG. 6, the present embodiment is featured in that an illumination light beam and an observation light beam transmit the negative refractive index mediums 383 and 384 a total of two times in an opposite direction.

While a case of g≧0 has been given in the foregoing description, the following formula may be established:

$$g<0 \qquad \text{Formula (0-5)}$$

This is because an image forming relationship can be maintained without any collision between optical elements as long as the following formula is established:

$$d+g>0 \qquad \text{Formula (0-6)}$$

"g<0" means that the intermediate image forming point FF enters a lens (for example, 306-1). However, if "g" is too small, a condition for complete image formation is not satisfied. Thus, it is desirable to satisfy the following formula:

$$-t<g<0 \qquad \text{Formula (0-7)}$$

Depending on usage, the following formula may be satisfied:

$$-3t<g<0 \qquad \text{Formula (0-8)}$$

Depending on an optical system, the following formula may be satisfied:

$$-10t<g<0 \qquad \text{Formula (0-9)}$$

In addition, d+g=0 may also be established.

When a value of "g" is indicated by an actual length, it is preferable that the following formula is established:

$$-100 \text{ mm}<g<0 \qquad \text{Formula (0-10)}$$

It becomes to manufacture a lens if the value of "g" is below the lower limit of formula (0-10). Thus, it is further preferable that the following formula is established:

$$-10 \text{ mm}<g<0 \qquad \text{Formula (0-11)}$$

It is still further preferable to define the upper limit of "g" is defined as (−0.1λ)/A in accordance with the formulas (0-5) to (0-11) because the evanescent wave can be reliably utilized and the dust or scratch, etc. on the lens surface 311 causes blurring, reducing adverse effect. It is preferable to define the upper limit of "g" is defined as (−0.6λ)/A in accordance with the formulas (0-5) to (0-11) because adverse effect due to the dust or scratch, etc is further reduced.

It is preferable to define the upper limit of "g" as (−1.3λ)/A in accordance with the formulas (0-5) to (0-11) because adverse effect caused by the dust or scratch, etc. is further significantly reduced.

The formula (1) may not be strictly observed. This is because an image position determined by the negative refractive index medium 301 may be displaced from formula (1) due to a manufacturing error of a refractive index of the negative refractive index medium 301, an error of planar precision, and the like. The following formula may be established:

$$0.8(WD+d) \leq t \leq 1.2(WD+d) \qquad \text{Formula (2)}$$

Depending on a product, the following formula may be permitted:

$$0.5(WD+d) \leq t \leq 1.5(WD+d) \qquad \text{Formula (3)}$$

Depending on a condition for utilizing the product, the following formula may be established:

$$0.15(WD+d) \leq t \leq 4.0(WD+d) \qquad \text{Formula (4)}$$

Alternatively, it is preferable that the following formula is satisfied because longer WD can be allocated:

$$t \leq 0.9(WD+d) \qquad \text{Formula (4-1)}$$

The way of thinking as described above is applied in the same manner as that in other embodiments of the present invention. In other embodiments as well, the refractive index of each of the negative refractive index mediums 383 and 384 is, for example, −1.

Figure 7:
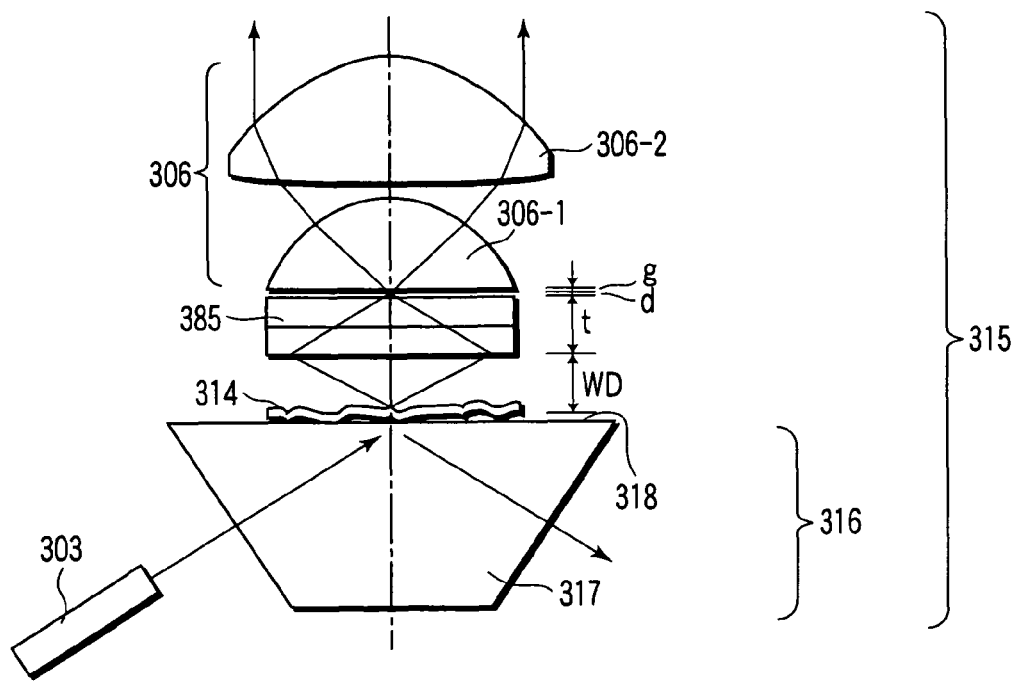
FIG. 7 is a view showing a transmission microscope 315 using a negative refractive index medium 385, according to another embodiment of the present invention.

FIG. 7 shows a transmission microscope 315 using a negative refractive index medium 385, according to another embodiment of the present invention. FIG. 7 illustrates only the vicinity of an illumination optical system 316 and an objective lens 306 in an enlarged view. Reference numeral 315 is allocated in air.

A light beam from a light source 303 enters a prism 317, and is incident to a face 318 of the prism 317 at the side of a sample 314 at an angle at which full reflection is made. Thus, the sample 314 is illuminated with an evanescent wave. The scattering light beam from the sample 314 is refracted on the negative refractive index medium 385, and the refracted light beam is completely formed as an image in the vicinity of an intermediate image forming point FF. Then, the resulting light beam is formed as an image again by the objective lens 306, and the formed image is observed.

Similarly, the formulas (0), (0-1), (0-1-0), (0-3), . . . , (0-11), (1), (2), (3), (4) and (4-1) apply to this example as well. Since chromatic dispersion of the negative refractive index medium 385 is eliminated, a clear and sharp image can be obtained even in the case where a wavelength width exists in 303.

Figure 8:
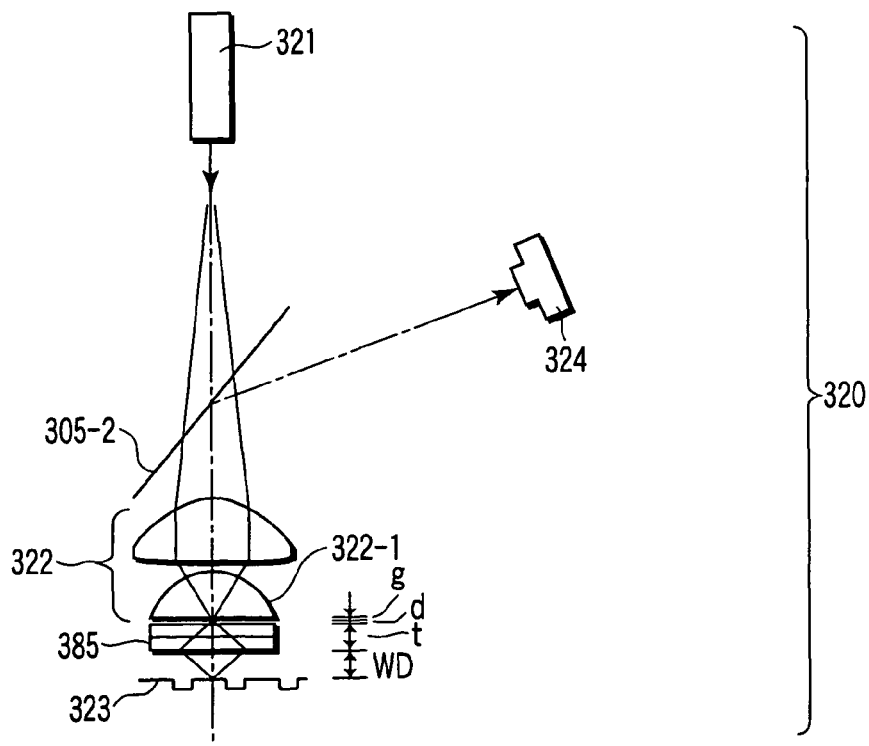
FIG. 8 is a view showing an embodiment of an optical system 320 of an optical disk.
Figure 9:
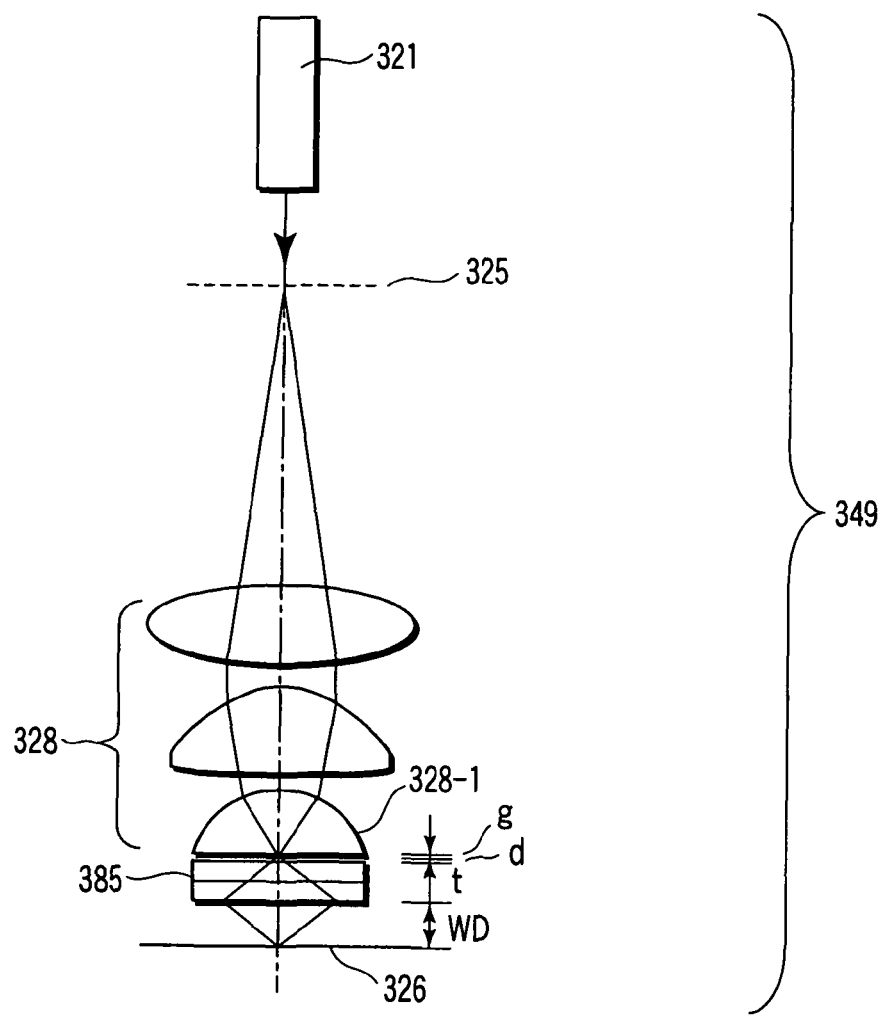
FIG. 9 is a view showing an embodiment of a projection exposure device 349 (such as a stepper) for use in LSI manufacture.

FIG. 7 and FIGS. 8 and 9 described later depict that a value of "d" is sufficiently smaller than that of WD and a value of "g" is close to 0 as well. The optical systems shown in FIGS. 5 and 7 can be applied to a scanning type microscope.

FIG. 8 shows an embodiment of an optical system 320 of an optical disk. A light beam emitted from a semiconductor laser serving as a light source 321 passes through a translucent mirror 305-2, an objective lens 322, and the negative refractive index medium 385, and is formed as an image on the optical disk 323. Then, a writing operation is carried out. NA of the objective lens 322 exceeds 1, an evanescent light beam is included in the objective lens 322 by means of a very small spot light beam in a non-contact manner, and writing operation with high density can be carried out. The optical system 320 is allocated in air.

An image forming relationship of the negative refractive index medium 385 may be such that a light beam is advanced in a direction opposite to that indicated by the arrow in the embodiment shown in FIG. 1. In the case of reading out a signal from the optical disk 323, the light beam emitted from the light source 321 is scattered on the optical disk 323, the scattered light beam travels from the negative refractive index medium 385 to the translucent mirror 305-2 via the objective lens 322, and the resulting light beam enters a photo detector 324. Then, readout operation with high NA can be carried out in a non-contact manner. Chromatic dispersion of the negative refractive index medium 385 is eliminated, and thus, even if a waveform fluctuation occurs with the light source 321, there is an advantage that recording and reproduction with high density can be carried out.

With a configuration provided at the time of write operation, as shown in FIG. 9, a photo mask 325 is allocated between the light source 321 and the objective lens 322; the optical disk 323 is replaced with a silicon wafer 326; and the photo mask 325 and the silicon wafer 326 are optically conjugated, whereby a projection exposure device 349 (such as a stepper) for LSI manufacturing can be provided. Conveniently, NA exceeds 1, and an evanescent wave can be used, so that exposure can be carried out with high resolution in a non-contact manner. In FIG. 9, an optical system of the projection exposure device is placed in a vacuum. Chromatic dispersion of the negative refractive index medium 385 is eliminated, and thus, lithography with high precision can be achieved even in the case where a wavelength width or a wavelength fluctuation etc. occurs with the light source.

Also in the embodiment shown in FIGS. 8 and 9, the formulas (0), (0-1), (0-1-0), (0-3), ... (0-11), (1), (2), (3), (4) and (4-1) are established.

In examples shown in FIGS. 5 to 9, a flat plate 382 and a lens close to the flat plate 382 are allocated to be spaced from each other.

By doing this, even is, for example, the negative refractive index mediums 382 and 383 are damaged while they collide with an object, it is preferable that only the negative refractive index mediums 383 and 383 are replaced with the replacement mediums because functional recovery can be achieved. Namely, repair is easily achieved.

Figure 10:
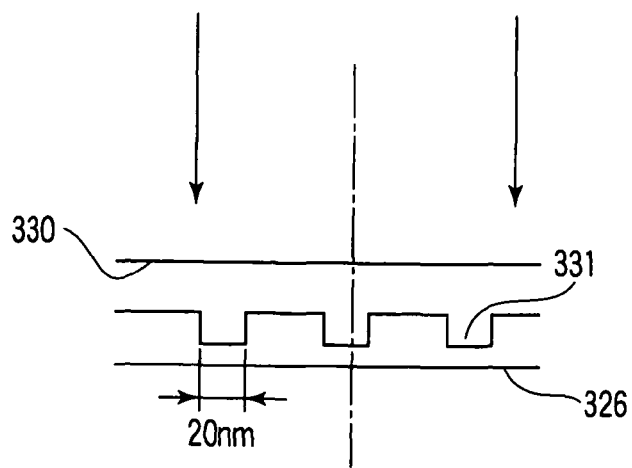
FIG. 10 is a view showing conventionally proposed intimate contact type lithography.

FIG. 10 is a view showing a conventionally proposed intimate contact type lithography. When illumination light is applied from above to a transparent polymer photo mask 330 having a line width of about 20 nm, an evanescent wave occurs below a protrusion portion 331, and a photo resist on the silicon wafer 326 is optically sensed. Then, LSI manufacture is carried out. The polymer photo mask 330 is a member having a fine structure. However, the polymer photo mask 330 and the silicon wafer 326 must come into intimate contact with each other, and therefore, there has been a problem that service life of the polymer photo mask 330 is short at the time of use and that the polymer photo mask 330 is easily damaged. This problem occurs even when a chrome photo mask is used instead of the polymer photo mask.

In view of this point, according to the present invention, lithography with high image resolution in a non-contact manner can be achieved by using the negative refractive index medium 385.

FIG. 11 is an illustrative view of such lithography wherein a parallel flat plate of the negative refractive index medium 301 is allocated in intimate contact with or very proximal to the polymer photo mask 330 between the silicon wafer 326 and the polymer photo mask 330. An optical system shown in FIG. 11 is allocated in a vacuum or in air.

By doing this, the evanescent wave generated below the protrusive portion 331 of the polymer photo mask 330 is completely formed as an image on the negative refractive index medium 385, and an image is produced on the silicon wafer 326. The image forming magnification is ×1. By doing thus, lithography with great WD and high image resolution can be achieved.

When a distance between the protrusive portion 331 and the negative refractive index medium 385 is defined as "d", the formulas (1) to (3), (4), and (4-1) are satisfied.

With respect to the objective lens 306, the objective lens 322, and the projection lens 328, it is desirable that NA of these optical systems at the object side, optical disk side, or silicone wafer 326 side is equal to or greater than 1.0, but the NA may be smaller than 1.0. For example, the NA may be 0.2 or more or less. This is because advantageous effect of increasing WD is attained by the negative refractive index medium 385.

It is preferable to set the above NA of the reference numerals 306, 322 and 328, etc. to be equal to or greater than 1.15 because high image resolution can be achieved.

It is further preferable to set the above NA to be equal to or greater than 1.3 because high image resolution can be achieved, the image resolution being equal to or having not achieved by a water immersion objective lens.

It is still further preferable to set the above NA to be equal to or greater than 1.5 because high image resolution equal to that of an oil immersion objective lens can be achieved.

With respect to the shape of the negative refractive index mediums 383 and 384, the shape of the negative refractive index mediums 383 and 384 may not be flat plates parallel to each other in the embodiments shown in FIGS. 5, 6, 7, 8 and 9.

As a negative refractive index medium, as shown in FIG. 12, there may be used a lens 301-2 formed of a negative refractive index medium, the lens having a recessed face on the object side thereof. In addition to advantageous effect of increasing WD, advantageous effect of aberration correction, etc. can be attained. In FIG. 12, the lens 301-2 made of a negative refractive index medium is a flat concave lens which is a flat lens on one side and is a curved convex lens on the other side, the flat concave lens with which a double convex lens is brought into contact. However, there may be formed in the shape of a double convex lens, a plat convex lens, a double concave lens, a meniscus convex lens, a meniscus concave lens, and the like.

The shape of a curved surface of the lens 301-2 made of a negative refractive index medium may be formed of a spherical face, an aspherical surface, a free curved surface, a rotational asymmetric face, or an extended curved surface, etc. In the embodiments shown in FIGS. 5, 6, 7, 8, 9 and 11, a negative refractive index medium 386 may be used instead of the negative refractive index medium 385. Alternatively, there may be used an optical system from which chromatic dispersion including three or more negative refractive index mediums has been eliminated.

Now, a description common to the present invention will be given here. A photonic crystal can be exemplified as a specific substance of the negative refractive index mediums 383 and 384. FIG. 13 shows a first specific example of the photonic crystal 340, and FIG. 14 shows a second specific example of the photonic crystal 340. As shown in FIGS. 13 and 14, the photonic crystal 340 is a substance having a periodic structure in order of $\lambda$ to $1/10\lambda$ and is produced in accordance with lithography or the like. A material includes a dielectric such as a synthetic resin such as $SiO_2$, acryl, or polycarbonate and GaAs. The unit λ used here denotes a wavelength of a light beam to be used. The values of repetition periods Sx, Sy and Sz in the X, Y and Z directions in the figure have values in order of λ to ⅒λ. It is known that a negative refractive index can be achieved in the vicinity of a band end of a photonic crystal (refer to non-patent document 3). It is preferable that the z direction in the figure is an optical axis of an optical system. The z axis denotes a direction of an axis which is the best in rotational symmetry of a photonic crystal.

It is desirable that Sx, Sy and Sz satisfy any of the formulas below:

$$\lambda/10 < Sx < \lambda \quad \text{Formula (5-1)}$$

$$\lambda/10 < Sy < \lambda \quad \text{Formula (5-2)}$$

$$\lambda/10 < Sz < \lambda \quad \text{Formula (5-3)}$$

Even if the values of Sx, Sy and Sz exceed their upper limits or are lower than their lower limits, a photonic crystal does not function.

Depending on usage, any of the formulas below may be satisfied:

$$\lambda/30 < Sx < 4\lambda \quad \text{Formula (5-4)}$$

$$\lambda/30 < Sy < 4\lambda \quad \text{Formula (5-5)}$$

$$\lambda/30 < Sz < 4\lambda \quad \text{Formula (5-6)}$$

With respect to a negative refractive index medium, it is known that a refractive index of the medium is $-\sqrt{\epsilon\mu}$ when a specific dielectric $\epsilon$ of a medium is negative and a specific permeability $\mu$ of a medium is negative.

In addition, usable examples of the negative refractive index medium include: a substance exhibiting negative refraction; a substance exhibiting approximately negative refraction, for example, a thin film made of silver, gold, or copper; a substance exhibiting a negative refractive index with respect to a specific polarizing direction; or a thin film made of a substance having substantially uniform dielectric $\epsilon$.

Further, a negative refractive index medium may be referred to as a left handed material. In the present application, all negative refractive mediums are referred to as so, including these negative refractive index mediums, left handed material, a substance exhibiting approximately negative refraction, a substance exhibiting a negative refractive index with respect to a specific polarizing direction; and a thin film made of a substance whose dielectric $\epsilon$ is substantially −1. A substance indicating complete image formation is also included in a medium exhibiting negative refraction. In the case of a thin film whose dielectric $\epsilon$ is substantially −1, the following formula may be satisfied:

$$-1.2 < \epsilon < -0.8 \quad \text{Formula (5-7)}$$

Depending on usage, the following formula may be established:

$$-1.6 < \epsilon < -0.5 \quad \text{Formula (5-8)}$$

Usable examples of a wavelength of a light beam to be used include without being limited thereto: a continuous spectrum light source; an incandescent light source; a sum of a plurality of single light beams; and a low coherent light source such as a super luminescent diode.

It is preferable that a wavelength of 0.1 μm to 3 μm is used because transmission can be obtained even in air and a light source can be easily obtained. It is further preferable that a visible wavelength is used in terms of availability. It is still further preferable to set a wavelength to be equal to or smaller than 0.6 μm because image resolution is improved.

Now, a detailed description of WD will be given below.

It is preferable that a value of WD is obtained in accordance with the formula below:

$$100 \text{ nm} \leq WD \leq 20 \text{ mm} \quad \text{Formula (7)}$$

If the above value is lower than the lower limit of formula (7), an actuation distance is too short, and handling becomes difficult. If the above value exceeds the upper limit of formula (7), a negative refractive index medium is too large, which is disadvantageous in terms of cost efficiency and processing property. In addition, there is a problem that dimensions of an optical device become too large.

Depending on a product, the following formula can be permitted:

$$20 \text{ nm} \leq WD \leq 200 \text{ mm} \quad \text{Formula (8)}$$

A further usable optical device can be obtained in accordance with the formula below:

$$1100 \text{ nm} \leq WD \leq 200 \text{ mm} \quad \text{Formula (8-0-1)}$$

A still further usable optical device can be obtained and a mechanism for determining WD of an optical device is simplified in accordance with the formula below:

$$0.01 \text{ mm} \leq WD \leq 200 \text{ mm} \quad \text{Formula (8-0-2)}$$

A yet further usable optical device can be obtained and mechanism precision of the optical device can be further improved:

$$0.1 \text{ mm} \leq WD \leq 200 \text{ mm} \quad \text{Formula (8-0-3)}$$

Moreover, the following formula is preferably satisfied:

$$WD > d \quad \text{Formula (8-1)}$$

This is because, if the value of "t" is kept unchanged, a smaller value of "d" can increase WD.

Depending on a product, the following formula may be permitted:

$$WD > 0.1d \quad \text{Formula (8-2)}$$

It is preferable to set a smaller value of "d" because the size of the lenses 306, 322 and 328 etc. can be reduced.

In order to improve image resolution, it is desirable that a value of "d" satisfies the following formula:

$$d \geq 0 \quad \text{Formula (8-2-1)}$$

Depending on usage, the following formula may be satisfied:

$$d < 0 \quad \text{Formula (8-2-2)}$$

When the lower limit of "d" is set to 0.1λ/A in accordance with the formula (8-2-1), FF is close to the 306-1 side, and an evanescent wave can be easily utilized. In addition, the dust, scratch and the like on the face 310 cause blurring. Such a situation is further preferable because adverse effect is reduced.

It is preferable to set the lower limit of "d" to 0.6λ/A in accordance with formula (8-2-1) because an evanescent wave is easily further utilized, and thus, image resolution is easily improve and effect due to dust or scratch, etc. can be further reduced.

It is preferable to set the lower limit of "d" to 1.3λ/A in accordance with formula (8-2-1) because an evanescent wave is easily utilized further significantly, and thus, image resolution is easily improved and effect due to dust or scratch, etc. is further significantly reduced.

Although A denotes the numerical apertures in FF of an optical system, A=1 is obtained in an optical system in which FF cannot be defined as shown in FIG. 11.

It is preferable to set the lower limit of "d" to 0.005 mm in accordance with formula (8-2-1) because a distance between the flat plate 382 made of a negative refractive index medium and a top lens system is easily increased, and thus, a frame structure for maintaining the distance between the flat plate 382 and the top lens system is easily simplified.

It is further preferable to set the upper limit of "d" to $(-0.1\lambda)/A$ in accordance with formula (8-2-2) because the dust, scratch and the like on the face 310 cause blurring and adverse effect due to dust or scratch is further reduced.

It is preferable to set the upper limit of "d" to $(-0.6\lambda)/A$ in accordance with formula (8-2-2) because adverse effect due to dust or scratch is further reduced.

It is preferable to set the upper limit of "d" to $(-1.3\lambda)/A$ in accordance with formula (8-2-2) because adverse effect due to dust or scratch is further reduced.

However, A denotes the numerical apertures (NA) relating to FF such as the image forming optical systems 306, 322 and 328.

Here, adverse effect due to the dust or scratch on an optical face on image forming performance is summarized. As has been described in conditional formulas of "g" and "d", adverse effect due to the dust or scratch on the optical face is reduced as a distance up to an optical face immediately preceding or immediately succeeding FF becomes long.

The term "distance" used here denotes an optical length (air conversion length).

It is desirable that such a distance is equal to or greater than at least $0.1\lambda/A$. It is further preferable to set $0.6\lambda/A$ or more or $1.3\lambda/A$ or more. The above-described optical face also includes a surface of a negative refractive index medium.

Further, it is desirable to vary a value of WD by devising a mechanism structure of an optical device. A stage, etc. of a microscope is provided as one example.

In addition, the negative refractive index medium 382 and a face of a lens, which is the closest to the negative refractive index medium 382 (face 311 in FIG. 6) may be adhered to each other. Or, the negative refractive index medium 385 may be formed while a lens (306-1 in FIG. 7) is used as a substance. In these cases, a value of "d" is approximately 0 or is equal to 0.

Alternatively, the negative refractive index mediums 383 and 384, etc. are formed on a transparent flat plate, and this transparent flat plate may be allocated so as to form a part of a lens used for image formation. As a place to be allocated, the most frontal portion (object side of the lens 306-1 in FIG. 5) or the last portion (wafer side of the lens 328 in FIG. 9) of an image forming lens system (the objective lens 306 in FIG. 5) is preferred. It is preferable that a lens or a flat plate used as a substrate is made of a material having a positive refractive index because it can be fabricated at a low cost. As described above, even in the case where the negative refractive index mediums 383 and 384 are provided on a substrate, the values of WD and "d" are measured from a surface of the negative refractive index mediums 383 and 384.

Figure 15:
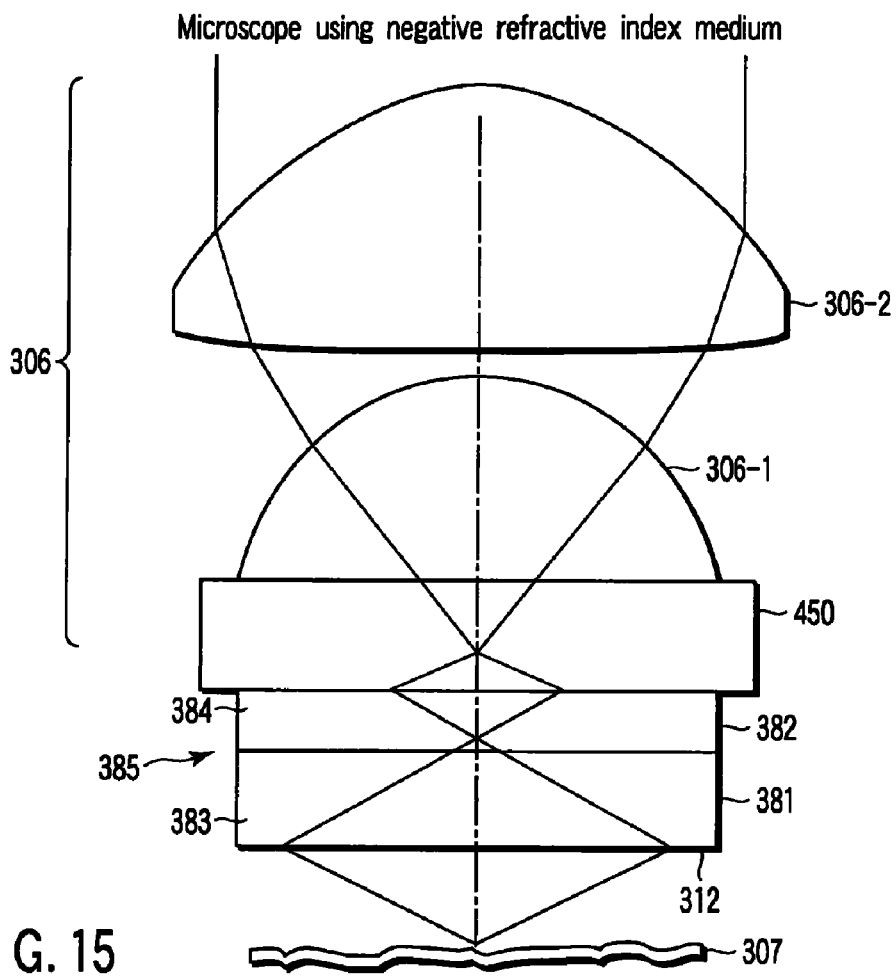
FIG. 15 is a view showing an example of an epi-illumination fluorescence microscope 302 using flat plate shapes 383 and 384 formed on a flat plate 450 made of a material having a positive refractive index.

FIG. 15 shows an example of an epi-illumination fluorescence microscope 302 using the flat shaped negative refractive mediums 383 and 384 formed on a flat plate 450 made of a material having a positive refractive index.

An intermediate image forming point FF forming the lens 306 by integrating elements 450, 306-1 and 306-2 slightly enters the element 450. While the elements 306-1 and 450 are adhered to each other, they may be brought into intimate contact with each other. Formulas (12) and (13) can apply to a refractive index of the element 450 as well. The thus configured optical system can also be applied to examples shown in FIGS. 7, 8, 9 and 11.

With respect to a condition for complete image formation or a deviation from the formula (1), the image forming state is imparted as a value of $|\Delta|$ increases when the following formula is established:

$$WD + d - t = \Delta \quad \text{Formula (8-3)}$$

The above impairment can be suppressed by the lowering of a certain degree of the image forming state when the following formula is established:

$$|\Delta| < \lambda \quad \text{Formula (8-4)}$$

Depending on a practical product, the following formula can be permitted:

$$|\Delta| < 10\lambda \quad \text{Formula (8-4-1)}$$

Depending on a use condition, the following formula can be permitted:

$$|\Delta| < 100\lambda \quad \text{Formula (8-5)}$$

It may be preferable to set the lower limit of $|\Delta|$ in accordance with the formulas (8-4-1) to (8-5) because there is an advantage such that WD can be allocated to be long.

When a refractive index of the negative refractive index medium 383 or 384 is defined as "n", n<0 is established. In the embodiment described above, n=−1 has been established. In the case of a parallel plate made of the negative refractive index medium 383 or 384, it is ideal that n=−1 is established. However, in actuality, n=−1 cannot be established because of a fabrication error or a deviation of a use wavelength of the negative refractive index medium 383 or 384. At this time, it is desirable to satisfy the following formula:

$$-1.1 < n < -0.9 \quad \text{Formula (9)}$$

If a value of "n" is out of the above range, complete image formation is not established, so that image resolution is lowered. Depending on a product, the following formula may be established:

$$-1.5 < n < -0.5 \quad \text{Formula (10)}$$

In usage such as mere increasing WD, it may be preferable that the following formula be established:

$$-3 < n < -0.2 \quad \text{Formula (11)}$$

When a refractive index of a lens or an optical element (306-1, 322-1 and 328-1 in FIGS. 5, 8 and 9) which is the closest to the negative refractive index medium is defined as N, it is preferable that image resolution is increased as N increases.

The above element can be utilized for wide usage when the following formula is established:

$$N \geq 1.3 \quad \text{Formula (12)}$$

It is further preferable that the following formula is established:

$$N \geq 1.7 \quad \text{Formula (13)}$$

It is preferable to define the upper light value of N as 1.82 in the formulas (12) and (13) because glass absorption (coloring) is reduced. It is preferable to establish the following formula because high image resolution can be achieved although coloring is made:

$$N \geq 1.86 \quad \text{Formula (13-1)}$$

In the formulas (0-4), (9), (10) and (11), the refractive index n represents a refractive index with respect to air in the case where the periphery is air, and represents a refractive index with respective to a vacuum in the case where the periphery is a vacuum. Namely, this refractive index denotes a specific refractive index with respect to the peripheral medium. Better image forming performance can be obtained by the fact that, when the periphery is a vacuum, vacuum ultraviolet light having a short wavelength can be used and the fact that the lowering of image resolution due to air undulation does not occur. It is preferable that the periphery is a vacuum because an optical device can be easily manufactured and handling is simplified. It is also preferable that only an optical path at the periphery of the negative refractive index medium 385 or the negative refractive index medium 386 is a vacuum, and that the remaining portions of an optical device are placed in air.

An optical device which can be easily handled and which is good in image forming performance can be obtained. A refractive index relevant to a vacuum of the elements 383 and 384 is defined as $n_V$, and a refractive index relevant to an air vacuum is defined as $n_A$. At one air atmosphere and a wavelength of 500 nm, $n_A$=1.0002818 is established.

A required condition for ideal complete image formation in the case where the periphery of an optical device is air is as follows:

$$n_V = -n_A \quad \text{Formula (20)}$$

A required condition for ideal complete image formation in the case where the periphery of an optical device is a vacuum is as follows:

$$n_V = -1.0 \quad \text{Formula (21)}$$

A value of "t" will be described here. In order to improve usability of an optical device in practice, WD is preferably increased. From formula (1), a value of WD is equal to that of "t". Therefore, it is preferable to establish the following formula:

$$0.1 \text{ mm} \leq t \leq 300 \text{ mm} \quad \text{Formula (15)}$$

If the value of "t" exceeds the upper limit, the optical device is increased, and is hardly manufactured.

Depending on a product, the following formula is permitted:

$$0.01 \text{ mm} \leq t \leq 300 \text{ mm} \quad \text{Formula (16)}$$

Depending on usage, either of the following formulas may be permitted:

$$1100 \text{ nm} \leq t \leq 200 \text{ mm} \quad \text{Formula (17)}$$

$$100 \text{ nm} \leq t \leq 50 \text{ mm} \quad \text{Formula (18)}$$

In addition, it is preferable to satisfy the formula (15) or (16) because mechanical strength of a negative refractive index medium serving as an optical element increases and the optical device can be easily handled at the time of assembling it.

Alternatively, it is preferable to satisfy the above formula because there is a possibility of eliminating a substrate for supporting a negative refractive index medium.

It is preferable to set the upper limit value of "t" to 0.01 mm in accordance with the formulas (17) and (18) because there is a possibility of manufacturing by vapor deposition or sputtering while a negative refractive index medium is used as a thin film.

For example, it is considered that a photonic crystal is fabricated in accordance with a self-cloning technique (refer to non-patent document 6).

It is further preferable to set a length measured along an optical axis of an optical system which includes a negative refractive index medium to equal to or smaller than 20 m because an optical system and an optical device can be easily fabricated.

Moreover, as shown in FIGS. 5, 7, 8 and 9 of the present application, the present invention is featured in that a distance between an object point (such as FF, 321 or 325) or an image point (such as real image in front of element 308 or image on FF or 324) relevant to an image forming optical system (such as 306, 322 or 328) and the image forming optical system is finite. In the case where an optical element has been formed of N negative refractive index mediums, such an optical element can be applied by substituting "t" with the following formula in the formulas (1), (0-7), (0-8), (0-9), (2), (3), (4) and (8-3):

$$\sum_{i=1}^{N} t_i$$

wherein N is an integer number equal to or greater than 1. Also, in the same case, the above optical element can be applied by substituting "t" with "$t_i$" in the formulas (15), (16), (17) and (18).

Furthermore, in the same case, the formula (0-4), (9), (10) and (11) are established by substituting "n" with the following formula:

$$\frac{n_i}{n_0}$$

Figure 16:
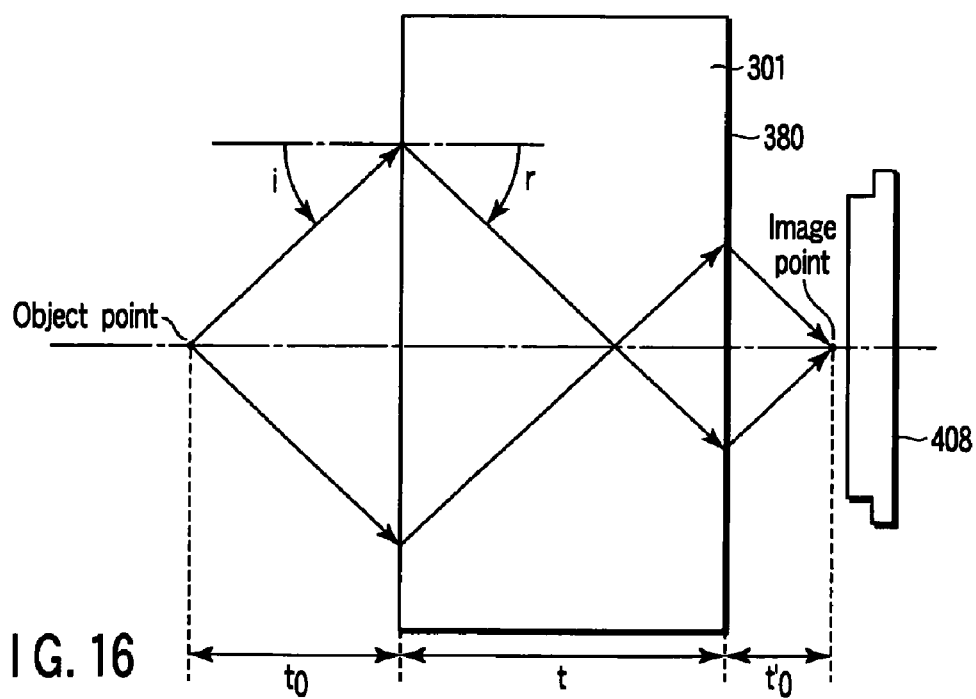
FIG. 16 is a view adopted to explain a technique for achieving image formation which exceeds a diffraction limit.

As shown in FIGS. 16 and 4, an image pickup element (solid state image pickup element such as CCD or C-MOS, for example) may be allocated at a position of an image point.

A small sized high performance optical device (image pickup device) can be achieved.

In the case where the term "optical" is used in the present application, the term includes an electromagnetic wave. While the term "complete image formation" has been used in the present application, this includes a case in which 100% complete image formation is not carried out (for example, a case in which image resolution is improved by 50%). Namely, for example, this includes a case in which a certain degree of image resolution is improved more remarkably than ordinary diffraction limit.

In the examples shown in FIGS. 5, 6, 7, 8, 9, 11, 12 and 15, a portion of WD (a portion between a negative refractive index medium and an object) or a portion of "d" may be filled with water or oil, etc.

When a refractive index of water or oil, etc. with respect to a vacuum is defined as $n_1$, a refractive index of the negative refractive index mediums 383 and 384 with respect to a vacuum may be defined as $-n_L$. It is preferable to define in the above-described manner because the refractive index of the negative refractive index mediums 383 and 384 may not be −1 and a material can be selected more flexibly. When "n" is replaced with $n_1/n_L$ or $n_2/n_L$, the formulas 9, 10 and 11 are established similarly.

Lastly, definitions of technical terms used in the present embodiment will be described here.

An optical device is a device including an optical system or an optical element. There is no need for an optical device only to function. Namely, the optical device may be part of equipment.

The optical device includes an image pickup device, an observation device, a display device, an illumination device, a signal processing device, an optical information processing device, a projection device, and a projection exposure device.

Examples of image pickup devices include a film camera, a digital camera, a digital camera for a PDA (personal digital assistant), a robot eye, a lens exchange type digital one-eye reflection camera, a television camera, a mobile image recording device, an electronic mobile image recording device, a cam coder, a VTR camera, a digital camera of a portable cellular phone, a television camera of a portable cellular phone, an electronic endoscope, a capsulated endoscope, an in-vehicle camera, a satellite camera, an interplanetary probe camera, a space probe camera, a monitoring device camera, eyes of a variety of sensors, a digital camera of a recorder, an artificial sight, a laser scanning type microscope, a projection exposure device, a stepper, an aligner, and an optical probe type microscope. Examples of electronic image pickup devices include a digital camera, a card type digital camera, a television camera, a VTR camera, a mobile image recording camera, a digital camera of a portable cellular phone, a television camera of a portable cellular phone, an in-vehicle camera, a satellite camera, an interplanetary probe camera, a space probe camera, and a digital camera of a recorder.

Examples of observation devices include a microscope, a telescope, a glass, binoculars, a loupe, a finder scope, a finder, a view finder, a contact lens, an intraocular lens, and an artificial sight.

Examples of display devices include a liquid crystal display, a view finder, a game machine (play station available from Sony), a video projector, a liquid crystal projector, a head mounted display (HMD), a personal digital assistant (PDA), a portable cellular phone, and an artificial sight.

A video projector, a liquid crystal projector and the like are also used as a projector device.

Examples of illumination devices include: a camera strobe, an automobile headlight, an endoscope light source, and a microscope light source.

Examples of signal processing devices include a portable cellular phone, a personal computer, a game machine, a reader/writer device of an optical disk, an arithmetic device of an optical computer, an optical interconnection device, an optical information processing device, an optical LSI, an optical computer, and a PDA.

An information transmitter device indicates: a portable cellular phone; a fixed telephone; a remote controller of a game machine, a television, a radio cassette or a stereo; and a device capable of inputting and transmitting any kind of information such as a personal computer, a personal computer keyboard, a mouse or a touch panel.

This transmitter device includes a television monitor equipped with an image pickup device; a personal computer monitor and a display.

The information transmitter device is included in the signal processing device.

The image pickup element indicates, for example, a CCD, an image pickup tube, a solid state image pickup element, a photography film, and the like. In addition, parallel flat plates are included one of prisms. An observer's change includes a change of vision. A change of an object includes a change of an object distance, an object movement, an object motion, a vibration, and an object fluctuation. An image pickup element, a wafer, an optical disk, a silver salt film and the like are examples of image forming members.

Definitions of an extended curved surface are as follows.

In addition to a spherical surface, a flat surface, and a rotationally symmetrical aspherical surface, any shape may be formed such as a spherical surface, a flat surface, and a rotationally symmetrical aspherical surface decentered with respect to an optical axis; an aspherical surface having symmetrical surfaces; an aspherical surface having only one symmetrical surface; an aspherical surface having no symmetrical surface; a free curved surface; and a surface having a differentiation disable point or line. A reflection surface or a refraction surface may also be available as long as it can have any influence on light.

In the present invention, these elements are referred to as extended curved surfaces.

The image forming optical system indicates: an image pickup optical system; an observation optical system; a projection optical system; a projection exposure optical system; a display optical system; and a signal processing optical system.

Example of the image pickup optical system include an image pickup lens of a digital camera.

Examples of the observation optical system include a microscope optical system and a telescope optical system.

Examples of the projection optical system include: a video projector optical system; a lithography optical system; a readout/write optical system of an optical disk; and an optical system of an optical pickup.

Examples of the projection exposure optical system includes a lithography optical system.

Examples of the display optical system include an optical system of a view finder of a video camera.

Examples of the signal optical system include: a readout/write optical system of an optical disk and an optical system of an optical pickup.

An optical element designates a lens, an aspherical lens, a mirror, a mirror, a prism, a free curved surface prism, a diffraction optical element (DOE), a non-uniform lens and the like. A parallel flat plate is one of the optical elements.

(Additional Information)

From the above-described specific embodiments, the inventions having the following constituent elements can be excerpted:

1. A medium exhibiting negative refraction, comprising use of a carbon nano tube for the medium exhibiting negative refraction.

2. An optical element comprising use of the medium set forth in item 1.

3. An optical system having a plurality of optical elements, each of which is formed of a medium exhibiting negative refraction, wherein said plurality of optical elements include optical elements having different chromatic dispersions.

3-2. An optical system having a plurality of optical elements, each of which is formed of a medium exhibiting negative refraction, wherein said plurality of optical elements include optical elements whose signs of chromatic dispersion are different from each other.

3-3. An optical system set forth in item 3 or 3-2, wherein the following formula is satisfied:

$$0.2 \leq H_N \leq 5 \qquad \text{Formula (143)}$$

In the above formula (143), $$H_N = -\frac{G_+}{G_-}$$

Formula (140)

where $G_+$ denotes a sum of position terms or terms of 0 angle each term of the following formula.

$G_-$ denotes a sum of negative terms or terms of 0 angle each term of the following formula.

$$\sum_{i=1}^{N} t_i \frac{\partial n_i}{\partial \omega} =$$

where N denotes the number of an optical element formed of a medium exhibiting negative refraction; $n_i$ denotes a refractive index relevant to a vacuum; $t_i$ denotes the thickness of an optical element formed of a medium exhibiting negative refraction; w denotes an optical vibration frequency.

4. An optical system including two optical elements, each of which is formed of a medium exhibiting negative refraction, wherein each of the two optical elements has different signs of chromatic dispersion.

4-2. An optical system set forth in item 4, wherein the following formula is satisfied:

$$0.2 \leq H \leq 5 \qquad \text{Formula (133)}$$

In the above Formula (133), $$H = -\frac{t_1 \frac{\partial n_1}{\partial \omega}}{t_2 \frac{\partial n_2}{\partial \omega}} \qquad \text{Formula (130)}$$

where $t_1$ and $t_2$ denote the thickness of an optical element formed of a medium exhibiting negative refraction; $n_1$ and $n_2$ denote a refractive index relevant to a vacuum of an optical element formed of a medium exhibiting negative refraction.

5. An optical system set forth in any one of items 3 to 4-2, wherein the medium exhibiting negative refraction which forms the optical element includes a photonic crystal or a substance indicating absorption in a vibration frequency region of a specific optical or electromagnetic wave.

5-1. An optical system set forth in any one of items 3 to 4-2, wherein the medium exhibiting negative refraction which forms the optical element includes a photonic crystal and a substance indicating absorption in a vibration frequency region of a specific optical or electromagnetic wave.

5-1-2. An optical system set forth in any one of items 3 to 4-2, wherein said plurality of optical elements each include: an optical element formed of a medium exhibiting negative refraction, the medium including a photonic crystal; and an optical element formed of a medium exhibiting negative refraction, the medium including a substance indicating absorption in a vibration frequency region of a specific optical or electromagnetic wave.

5-2. An optical system set forth in any one of items 3 to 4-2, wherein the optical element formed of a medium exhibiting negative refraction includes substances of different types indicating absorption in a vibration frequency region of a specific optical or electromagnetic wave.

5-2-2. An optical system set forth in any one of items 3 to 4-2, wherein said plurality of optical elements each include: an optical element formed of a medium exhibiting negative refraction, the medium including a first substance indicating absorption in a specific optical or electromagnetic wave; and an optical element formed of a medium exhibiting negative refraction, the medium including a second substance indicating absorption in a specific optical or electromagnetic wave.

6. An optical system comprising a plurality of optical elements, each of which is formed of a medium exhibiting negative refraction, wherein
said plurality of optical elements each include two optical elements which satisfies a predetermined relationship, and the predetermined relationship is a relationship that signs of chromatic dispersion are different from each other, an absolute value of an imaginary portion of one complex refractive index is greater than an absolute value of an imaginary portion of the other complex refractive index, and an absolute value of chromatic dispersion of a medium having a greater absolute value of an imaginary portion of the complex refractive index is greater than an absolute value of chromatic dispersion of the other one.

6-1. An optical system including two optical elements, each of which is formed of a medium exhibiting negative refraction, wherein
signs of chromatic dispersion of the optical elements each formed of a medium exhibiting negative refraction are different from each other, and
an absolute value of chromatic dispersion of a medium having a greater absolute value of an imaginary portion of a complex refractive index is greater than that of the other one.

6-2. An optical system including a plurality of optical elements, each of which is formed of a medium exhibiting negative refraction, wherein
two of said plurality of optical elements are different from each other in sign of chromatic dispersion, and
an absolute value of chromatic dispersion of a medium having a greater absolute value of an imaginary portion of a complex refractive index is greater than an absolute value of chromatic dispersion of the other medium.

6-3. An optical system including a plurality of optical elements, each of which is formed of a medium exhibiting negative refraction, wherein
two of said plurality of optical elements are different from each other in sign of chromatic dispersion, and
a thickness of a medium having a greater absolute value of an imaginary portion of a complex refractive index from among the two optical elements is smaller than that of the other medium.

7. An optical element or an optical system set forth in any one of items 2 to 6-3, wherein the optical elements are formed in the shape of parallel plates.

7-2. An optical element or an optical system set forth in any one of items 2 to 6-3, wherein the optical elements each have an optical face formed in the shape of a curved surface.

8. An optical device having an optical system set forth in any one of items 3 to 7-2, wherein the optical or electromagnetic wave to be used is an optical or electromagnetic wave having a width in vibration frequency.

9. An optical device having an optical system set forth in any one of items 3 to 7-2, wherein the optical or electromagnetic wave to be used is an optical or electromagnetic wave for which a vibration frequency changes or fluctuates.

10. An optical device comprising a combination of an image pickup element with the optical system set forth in any one of items 3 to 7-2.

11. An optical system or an optical device set forth in any one of items 3 to 10, comprising an optical element formed of a medium having a positive refractive index.

12. An optical system or an optical device set forth in any one of items 3 to 10, wherein an optical system and an image forming optical system, the optical system having an optical element formed of a medium exhibiting negative refraction, are allocated in combination with each other.

13. An optical device comprising: a member having a light source and a fine structure; and the optical system formed of a medium exhibiting negative refraction, the optical device carrying out image formation of the fine structure.

14. An optical element, an optical system or an optical device set forth in any one of items 1 to 13, wherein the medium exhibiting negative refraction is a negative refractive index medium.

15. An optical device having an optical element and an image forming element, the optical element being formed of a medium exhibiting negative refraction.

16. An optical device having: an optical element formed of a medium exhibiting negative refraction; an optical element formed of a medium having a positive refractive index; and an image forming element.

17. A lens formed of a medium exhibiting negative refraction.

17-1. A lens having a flat surface on one side, wherein the lens is formed of a medium exhibiting negative refraction.

17-2. A double-concave or double-convex lens formed of a medium exhibiting negative refraction.

17-3. A meniscus lens formed of a medium exhibiting negative refraction.

17-4. A lens having an aspherical surface, wherein the lens is formed of a medium exhibiting negative refraction.

17-5. A lens having a rotationally asymmetrical surface, wherein the lens is formed of a medium exhibiting negative refraction.

17-6. A lens having an extended curved surface, wherein the lens is formed of a medium exhibiting negative refraction.

17-7. A lens having an optical element made of a material having a positive refractive index and having a medium exhibiting negative refraction, formed on the optical element while the optical element is used as a substrate.

17-8. An optical element having an optical element made of a material having a positive refractive index and having a medium exhibiting negative refraction, formed on the optical element while the optical element is used as a substrate.

17-9. An optical element having a transparent flat plate and having a medium exhibiting negative refraction, formed on the flat plate while the flat plate is used as a substrate.

17-10. An optical element having a transparent flat plate made of a material having a positive refractive index and having a medium exhibiting negative refraction, formed on the flat plate while the flat plate is used as a substrate.

18. An optical system having an optical element formed of a medium exhibiting negative refraction.

19. An optical system having an optical element formed of a medium exhibiting negative refraction and the other optical element.

19-1. An optical system having an optical element formed of a medium exhibiting negative refraction and an optical element formed of a medium having a positive refractive index.

19-1-1. An optical system having an optical element formed of a medium exhibiting negative refraction and an optical element formed of a medium having a positive refractive index, wherein a gap is provided between an optical element formed of a medium having a positive refractive index, which is the most proximal to the optical element formed of a medium exhibiting negative reflection and the optical element formed of a medium exhibiting negative reflection.

20. An optical system, wherein an optical element formed of a medium exhibiting negative refraction and an image forming optical system are allocated in combination with each other.

20-0. An optical system having an image forming relationship based on an optical element formed of a medium exhibiting negative refraction, and further having an optical element other than the optical element formed of a medium exhibiting negative refraction.

20-1. An optical system including both of an image forming relationship based on an optical element formed of a medium exhibiting negative refraction and an image forming relationship based on an image forming optical system.

20-2. An optical system, wherein an object image is formed by an optical element formed of a medium exhibiting negative refraction, and the formed image is formed as an image again by an image forming optical system.

20-3. An optical system, wherein an object image is formed as an image by an image forming optical system, and the formed image is formed as an image again by an optical element formed of a medium exhibiting negative refraction.

20-4. An optical system set forth in any one of items 18 to 20-3, wherein an object has a two-dimensional or three-dimensional shape.

20-5. An optical system set forth in any one of items 18 to 20-4, wherein light passes through the medium exhibiting negative refraction twice.

20-6. An optical system set forth in any one of items 18 to 20-5, wherein the optical element formed of a medium exhibiting negative refraction is a parallel plate.

20-7. An optical system set forth in any one of items 18 to 20-6, wherein either of the following formulas is satisfied:

$$0 \leq g \leq 1000\lambda \qquad \text{Formula (0-1-0)}$$

$$g<0 \qquad \text{Formula (0-5)}$$

20-8. An optical system set forth in any one of items 18 to 20-7, wherein the following formula is satisfied:

$$0.15(WD+d) \leq t \leq 4.0(WD+d) \qquad \text{Formula (4)}$$

where WD denotes a distance between the medium exhibiting negative refraction and an object or an image surface; d denotes a distance between the medium exhibiting negative refraction and an intermediate image forming point of an optical system; and "t" denotes a thickness of the medium exhibiting negative refraction.

20-9. An optical system set forth in any one of items 18 to 20-8, wherein a refractive index of the medium exhibiting negative refraction is about −1.

20-9-1. An optical system set forth in any one of items 18 to 20-8, wherein a refractive index n of the medium exhibiting negative refraction is not −1 and satisfies the following formula:

$$-3<n<-0.2 \qquad \text{Formula (11)}$$

20-10. An optical system set forth in any one of items 18 to 20-8, wherein a refractive index n of the medium exhibiting negative refraction satisfies the following formula:

$$-3<n<-0.2 \qquad \text{Formula (11)}$$

20-11. An optical system set forth in any one of items 18 to 20-10, wherein NA on an object side or an image side of the optical system or of an intermediate image is a value which exceeds 0.2.

20-12. An optical system set forth in any one of items 18 to 20-10, wherein NA on an object side or an image side of the optical system or of an intermediate image is smaller than 1.0.

20-13. An optical system set forth in any one of items 18 to 20-10, wherein NA on an object side or an image side of the optical system or of an intermediate image is equal to or greater than 1.

20-13-1. An optical system set forth in any one of items 18 to 20-10, wherein NA on an object side or an image side of the optical system or of an intermediate image is a value which exceeds 1.15.

20-13-2. An optical system set forth in any one of items 18 to 20-10, wherein NA on an object side or an image side of the optical system or of an intermediate image is a value which exceeds 1.3.

20-13-3. An optical system set forth in any one of items 18 to 20-10, wherein NA on an object side or an image side of the optical system or of an intermediate image is a value which exceeds 1.5.

20-14. An optical system set forth in any one of items 18 to 20-13, wherein a distance between the medium exhibiting negative refraction and an object or an image satisfies the following formula:

$$20\ nm \leq WD \leq 200\ mm \qquad \text{Formula (8)}$$

where WD denotes a distance between a medium exhibiting negative refractive index and an object.

20-15. An optical system set forth in any one of items 18 to 20-14, wherein the following formula is satisfied:

$$WD > 0.1d \qquad \text{Formula (8-2)}$$

where WD denotes a distance between a medium exhibiting negative refractive index and an object.

20-16. An optical system set forth in any one of items 18 to 20-15, wherein the following formula is satisfied:

$$|\Delta| < 100\lambda \qquad \text{Formula (8-5)}$$

where $\Delta = WD + d - t$, and $\lambda$ denotes a wavelength of light.

20-17. An optical system set forth in any one of items 18 to 20-16, wherein an image forming optical system is arranged at the rear of the optical element formed of a medium exhibiting negative refraction.

20-18. An optical device having the optical system set forth in item 20-17.

20-19. A microscope having the optical system set forth in item 20-17.

20-20. An epi-illumination microscope having the optical system set forth in item 20-17.

20-21. A transmission microscope having the optical system set forth in item 20-17.

20-22. An observation device having the optical system set forth in item 20-17.

20-23. An image pickup device having the optical system set forth in item 20-17.

20-23-1. A scanning type microscope having the optical system set forth in item 20-17.

20-24. An optical device set forth in any one of items 18 to 20-16, wherein an image forming optical system is arranged in front of the optical element formed of a medium exhibiting negative refraction.

20-25. An optical device having the optical system set forth in item 20-24.

20-26. An optical disk device having the optical system set forth in item 20-24.

20-27. A projection exposure device having the optical system set forth in item 20-24.

20-28. A projection device having the optical system set forth in item 20-24.

20-29. A signal processing device having the optical system set forth in item 20-24.

20-30. An image pickup device having the optical system set forth in item 20-24.

20-31. An optical device having the optical system set forth in item 20-24.

20-32. An optical device or an optical system set forth in any one of items 18 to 20-31, the following formula is satisfied:

$$N \geq 1.3 \qquad \text{Formula (12)}$$

where N denotes a refractive index of a lens or an optical element closest to the negative refractive index medium.

20-33. An optical device set forth in any one of items 18 to 20-31, wherein the optical element formed of a medium exhibiting negative refraction has any one of the configurations set forth in items 17 to 17-10.

20-34. An optical device or an optical system set forth in any one of items 18 to 20-32, having the lens or optical element set forth in items 17-7 to 17-10, wherein the substrate configures a part of the image forming system or of the optical system.

20-35. An optical device or an optical system set forth in any one of items 18 to 20-32, having the lens or optical element set forth in items 17-7 to 17-10, wherein the substrate configures a part of the image forming system or of the optical system, and the substrate is positioned at the opposite side to the object with respect to the medium exhibiting negative refraction.

20-35-1. An optical device or an optical system set forth in any one of items 18 to 20-33, having the lens or optical element set forth in items 17-7 to 17-10, wherein the substrate configures a part of the image forming optical system or of the optical system, and the substrate is adhered to an optical element configuring the image forming optical system.

20-35-2. An optical device or an optical system set forth in any one of items 19 to 20-32, wherein the medium exhibiting negative refraction and an optical element configuring an optical system are adhered to each other.

20-36. An optical device or an optical system set forth in item 20-34, wherein a refractive index N of the substrate satisfies the following formula:

$$N \geq 1.3 \qquad \text{Formula (12)}$$

20-37-1. An image forming optical system having an optical element formed of a medium exhibiting negative refraction.

20-37-2. An image forming optical system having an optical element formed of a medium exhibiting negative refraction and the other optical element.

20-37-3. An image forming optical system having an optical element formed of a medium exhibiting negative refraction and an optical element formed of a medium having a positive refractive index.

20-38-1. An image pickup optical system having an optical element formed of a medium exhibiting negative refraction.

20-38-2. An image pickup optical system having an optical element formed of a medium exhibiting negative refraction and the other optical element.

20-38-3. An image pickup optical system having an optical element formed of a medium exhibiting negative refraction and an optical element formed of a medium having a positive refractive index.

20-39-1. An observation image optical system having an optical element formed of a medium exhibiting negative refraction.

20-39-2. An observation image optical system having an optical element formed of a medium exhibiting negative refraction and the other optical element.

20-39-3. An observation image optical system having an optical element formed of a medium exhibiting negative refraction and an optical element formed of a medium having a positive refractive index.

20-40-1. A signal processing system having an optical element formed of a medium exhibiting negative refraction.

20-40-2. A signal processing system having an optical element formed of a medium exhibiting negative refraction and the other optical element.

20-40-3. A signal processing system having an optical element formed of a medium exhibiting negative refraction and an optical element formed of a medium having a positive refractive index.

21. An optical device comprising a member having a light source and a fine structure and an optical element formed a medium exhibiting negative refraction, wherein image formation of the fine structure is carried out.

21-0-1. An optical device, wherein a member having a light source and a fine structure and an optical element formed of a medium exhibiting negative refraction are allocated in order, and image formation of the fine structure is carried out.

21-1. An exposure device, wherein a light source, a photo mask, and an optical element formed of a medium exhibiting negative refraction are allocated in order, and exposure is carried out on a wafer.

21-2. An optical device set forth in any one of items 21 to 21-1, the optical element formed a medium exhibiting negative refraction is a parallel flat plate.

21-3. An optical device set forth in item 21-2, wherein the following formula is satisfied:

$$0.15(WD+d) \leq t \leq 4.0(WD+d) \quad \text{Formula (4)}$$

where WD denotes a distance between the medium exhibiting negative refraction and an image surface or a wafer; "d" denotes a distance between the medium exhibiting negative refraction and a member or a photo mask having a fine structure; and "t" denotes a thickness of the medium exhibiting negative refraction.

21-4. An optical device set forth in any one of items 21 to 21-3, wherein a refractive index of the medium exhibiting negative refraction is about −1.

21-4-1. An optical device set forth in any one of items 21 to 21-3, wherein a refractive index n of the medium exhibiting negative refraction is not −1 and satisfies the following formula:

$$-3 < n < -0.2 \quad \text{Formula (11)}$$

21-5. An optical device set forth in any one of 21 to 21-3, wherein a refractive index n of the medium exhibiting negative refraction satisfies the following formula:

$$-3 < n < -0.2 \quad \text{Formula (11)}$$

21-6. An optical device or an exposure device set forth in any one of 21 to 21-5, wherein a distance between the medium exhibiting negative refraction and an image surface satisfies the following formula:

$$20 \text{ nm} \leq WD \leq 200 \text{ mm} \quad \text{Formula (8)}$$

21-7. An optical device set forth in any one of 21 to 21-6, wherein the following formula is satisfied:

$$WD > 0.1d \quad \text{Formula (8-2)}$$

21-8. An optical device set forth in any one of 21 to 21-7, wherein the following formula is satisfied:

$$|\Delta| < 100\lambda \quad \text{Formula (8-5)}$$

where $\Delta = WD + d - t$, and $\lambda$ denotes a wavelength of light.

21-8-1. An optical device set forth in any one of 21 to 21-7, wherein the optical element formed of a medium exhibiting negative refraction has any one of the configurations set forth in items 17-8 to 17-10.

21-9. An optical device or an optical system or a lens set forth in any one of 17 to 21-8-1, wherein a photonic crystal is used as a medium exhibiting negative refraction.

21-9-1. An optical device or an optical system or a lens set forth in any one of 17 to 21-8, wherein a photonic crystal is used as a medium exhibiting negative refraction and a Z axis of the photonic crystal is oriented in an optical axis direction of an optical element or an optical system.

21-10. An optical device or an optical system or a lens set forth in item 21-9, wherein any one of the following formulas is satisfied:

$$\lambda/30 < Sx < 4\lambda \quad \text{Formula (5-4)}$$

$$\lambda/30 < Sy < 4\lambda \quad \text{Formula (5-5)}$$

$$\lambda/30 < Sz < 4\lambda \quad \text{Formula (5-6)}$$

21-11. An optical device or an optical system or a lens set forth in any one of items 17 to 21-10, wherein light to be used is single color light.

21-12. An optical device or an optical system or a lens set forth in any one of 17 to 21-9, wherein a wavelength of light to be used ranges from 0.1 µm to 3 µm.

21-12-1. An optical device or an optical system or a lens set forth in any one of items 18 to 21-12, having a light source.

21-13. An optical device or an optical system or a lens set forth in any one of 17 to 21-12, wherein an object or an image forming member is illuminated by a light source and light from the light source.

21-14. An optical device or an optical system or a lens set forth in any one of items 17 to 20-15 or 20-17 to 21-13, wherein an evanescent wave is used for image formation.

21-15. An optical device or an optical system or a lens set forth in any one of items 18 to 21-14, wherein a distance between the medium exhibiting negative refraction and an object or an image forming member is variable.

22-10. An optical device or an optical system or a lens set forth in any one of items 17 to 21-15, wherein the periphery of the medium exhibiting negative refraction is air.

22-11. An optical device or an optical system or a lens set forth in any one of items 17 to 21-15, wherein the periphery of the medium exhibiting negative refraction is a vacuum.

22-12. An optical device or an optical system or a lens set forth in any one of items 17-8 to 17-10 or any one of 20-11 to 21-8 and 21-9 to 21-17 excluding 21-8-1, wherein the optical element formed of a medium exhibiting negative refraction is a parallel plate.

22-13. An optical device or an optical system or a lens set forth in any one of items 17 to 22-12, wherein a thickness of the optical element formed of a medium exhibiting negative refraction satisfies any one of the following formulas:

$$0.1 \text{ mm} \leq t \leq 300 \text{ mm} \quad \text{Formula (15)}$$

$$0.01 \text{ mm} \leq t \leq 300 \text{ mm} \quad \text{Formula (16)}$$

$$1100 \text{ nm} \leq t \leq 200 \text{ mm} \quad \text{Formula (17)}$$

$$100 \text{ nm} \leq t \leq 50 \text{ mm} \quad \text{Formula (18)}$$

23-1. An optical device comprising an optical system, the optical device having an optical element and an image forming optical system, the optical element being formed of a medium exhibiting negative refraction, wherein an absolute value of a distance from an intermediate image forming point of the image forming optical system to a surface of the optical element formed of a medium exhibiting negative refraction is equal to or greater than $0.1\lambda/A$, where A denotes the numerical apertures obtained at the intermediate image forming point of the image forming optical system.

23-2. An optical device comprising an optical system, the optical device having an optical element and an image forming optical system, the optical element being formed of a medium exhibiting negative refraction, wherein an absolute value of a distance from an optical face of the image forming optical system which is the closest to the optical element formed of a medium exhibiting negative refraction to the intermediate image forming point of the image forming optical system is equal to or greater than $0.1\lambda/A$, where A denotes the numerical apertures obtained at the intermediate image forming point of the image forming optical system.

23-3. An optical device comprising: a member having a light source and a fine structure; and an optical element formed of a medium exhibiting negative refraction, wherein a distance between the member having the fine structure and the optical element formed of a medium exhibiting negative refraction is equal to or greater than $0.1\lambda$.

23-4. An optical device comprising an optical system, the optical device having an optical element and an image forming optical system, the optical element being formed of a medium exhibiting negative refraction, wherein a thickness of the optical element formed of a medium exhibiting negative refraction satisfies any one of the following formulas:

$0.1\ mm \leq t \leq 300\ mm$      Formula (15)

$0.01\ mm \leq t \leq 300\ mm$      Formula (16)

$1100\ nm \leq t \leq 200\ mm$      Formula (17)

$100\ nm \leq t \leq 50\ mm$      Formula (18)

23-5. An optical device comprising: a member having a light source and a fine structure; and an optical element formed of a medium exhibiting negative refraction, wherein a thickness of the optical element formed of a medium exhibiting negative refraction satisfies any one of the following formulas:

$0.1\ mm \leq t \leq 300\ mm$      Formula (15)

$0.01\ mm \leq t \leq 300\ mm$      Formula (16)

$1100\ nm \leq t \leq 200\ mm$      Formula (17)

$100\ nm \leq t \leq 50\ mm$      Formula (18)

23-6. An optical device comprising an optical system which comprises an optical element formed of a medium exhibiting negative refraction, wherein a photonic crystal is used as a medium exhibiting negative refraction and an axis having the best rotation symmetry of the photonic crystal is oriented in an optical axis direction of the optical system.

23-7. An optical device having an optical system which comprises an optical element formed of a medium exhibiting negative refraction, wherein a length of the optical system measured along an optical axis of the optical system is equal to or smaller than 20 mm.

24-1. An optical device or an optical system or a lens set forth in any one of items 17 to 23-7, wherein the medium exhibiting negative refraction is a negative refractive index medium.

24-2. An optical device or an optical system or a lens set forth in any one of items 17 to 23-7, wherein the medium exhibiting negative refraction is a medium showing a property of complete image formation.

What is claimed is:

1. An optical system, comprising:
a plurality of optical elements,
each of the plurality of optical elements being formed of a medium exhibiting negative refraction,
wherein the plurality of optical elements include optical elements having different chromatic dispersions,
wherein the plurality of optical elements include optical elements whose signs of chromatic dispersion are different from each other.

2. An optical system according to claim 1, wherein the following formula is satisfied:

$0.2 \leq H_N \leq 5$      Formula (143)

In the above formula (143), $H_N = -G_+/G_-$      Formula (140)

where $G_+$ denotes a sum of position terms or terms of 0 angle each term of the following formula $G_-$ denotes a sum of negative terms or terms of 0 angle each term of the following formula $$\sum_{i=1}^{N} t_i \frac{\partial n_i}{\partial \omega} =$$

where N denotes the number of an optical element formed of a medium exhibiting negative refraction; $n_i$ denotes a refractive index relevant to a vacuum; $t_i$ denotes the thickness of an optical element formed of a medium exhibiting negative refraction; w denotes an optical vibration frequency.

3. An optical system according to claim 1, wherein the medium exhibiting negative refraction which forms the optical element includes a photonic crystal or a substance indicating absorption in a vibration frequency region of a specific optical or electromagnetic wave.

4. An optical system according to claim 1, wherein the medium exhibiting negative refraction which forms the optical element includes a photonic crystal and a substance indicating absorption in a vibration frequency region of a specific optical or electromagnetic wave.

5. An optical system according to claim 1, wherein the plurality of optical elements each include: an optical element formed of a medium exhibiting negative refraction, the medium including a photonic crystal; and an optical element formed of a medium exhibiting negative refraction, the medium including a substance indicating absorption in a vibration frequency region of a specific optical or electromagnetic wave.

6. An optical system according to claim 1, wherein the optical element formed of a medium exhibiting negative refraction includes substances of different types indicating absorption in a vibration frequency region of a specific optical or electromagnetic wave.

7. An optical system according to claim 1, wherein the plurality of optical elements each include: an optical element formed of a medium exhibiting negative refraction, the medium including a first substance indicating absorption in a specific optical or electromagnetic wave; and an optical element formed of a medium exhibiting negative refraction, the medium including a second substance indicating absorption in a specific optical or electromagnetic wave.

8. An optical system according to claim 1, wherein the optical elements are formed in the shape of parallel plates.

9. An optical system according to claim 1, wherein the optical elements each have an optical face formed in the shape of a curved surface.

10. An optical system comprising an optical or electromagnetic wave according to claim 1, wherein the optical or electromagnetic wave to be used is an optical or electromagnetic wave having a width in vibration frequency.

11. An optical system according to claim 1, wherein the optical or electromagnetic wave to be used is an optical or electromagnetic wave for which a vibration frequency changes or fluctuates.

12. An optical system comprising a combination of an image pickup element with the optical system according to claim 1.

13. An optical system according to claim 1, comprising an optical element formed of a medium having a positive refractive index.

14. An optical system according to claim 1, wherein an optical system and an image forming optical system, the optical system having an optical element formed of a medium exhibiting negative refraction, are allocated in combination with each other.

15. An optical system comprising: a member having a light source and a fine structure; and the optical system formed of a medium exhibiting negative refraction, the optical device comprising an optical system according to claim 1 for carrying out image formation of the fine structure.

16. An optical system according to claim 1, wherein the medium exhibiting negative refraction is a negative refractive index medium.

* * * * *